US012787832B2

(12) United States Patent
Li et al.

(10) Patent No.: US 12,787,832 B2

(45) Date of Patent: Nov. 3, 2026

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Ching-Chen Li, Hsinchu City (TW); Sung-Chi Chang, Hsinchu City (TW); Chin-Chuan Chang, Hsinchu County (TW); Wei-Jhan Tsai, Kaohsiung City (TW); Hao-Wei Lin, Hsinchu City (TW); Ying-Ching Shih, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 424 days.

(21) Appl. No.: 18/461,535

(22) Filed: Sep. 6, 2023

(65) Prior Publication Data

US 2025/0079283 A1 Mar. 6, 2025

(51) Int. Cl.

*H10W 70/685* (2026.01)
*H10W 74/10* (2026.01)
*H10W 90/00* (2026.01)

(52) U.S. Cl.

CPC ........ *H10W 70/685* (2026.01); *H10W 74/117* (2026.01); *H10W 90/00* (2026.01); *H10W 90/724* (2026.01); *H10W 90/794* (2026.01)

(58) Field of Classification Search

None

See application file for complete search history.

(56) References Cited

U.S. PATENT DOCUMENTS

| | | | |
|---|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

FOREIGN PATENT DOCUMENTS

| | | |
|---|---|---|
| CN | 115274982 | 11/2022 |
| TW | 202015213 | 4/2020 |

OTHER PUBLICATIONS

"Office Action of Taiwan Counterpart Application", issued on Sep. 30, 2024, p. 1-p. 3.

*Primary Examiner* — Nicholas J Tobergte

(74) *Attorney, Agent, or Firm* — JCIPRNET

(57) ABSTRACT

A package structure includes a first semiconductor die, a second semiconductor die, an insulating encapsulant and a redistribution layer. The insulating encapsulant laterally surrounds the first semiconductor die and the second semiconductor die, wherein the insulating encapsulant includes a first portion sandwiched in between the first semiconductor die and the second semiconductor die, the first portion has a first recessed part adjacent to an edge of the first semiconductor die, and a second recessed part adjacent to an edge of the second semiconductor die. The redistribution layer is disposed on and electrically connected to the first semiconductor die and the second semiconductor die.

20 Claims, 18 Drawing Sheets

PK2

(56) References Cited

U.S. PATENT DOCUMENTS

| | | | | |
|---|---|---|---|---|
| 9,666,502 | B2 | 5/2017 | Chen et al. | |
| 9,735,131 | B2 | 8/2017 | Su et al. | |
| 10,510,704 | B2 * | 12/2019 | Chen | H10P 72/74 |
| 12,538,808 | B2 * | 1/2026 | Chen | H10W 70/09 |
| 2020/0243449 | A1 * | 7/2020 | Chiang | H10P 72/74 |
| 2022/0122922 | A1 * | 4/2022 | Chen | H10P 72/74 |
| 2023/0036239 | A1 | 2/2023 | Espiritu et al. | |
| 2023/0065884 | A1 * | 3/2023 | Chen | H10W 40/22 |
| 2024/0395727 | A1 * | 11/2024 | Chen | H10P 72/74 |

* cited by examiner

PACKAGE STRUCTURE AND METHOD OF FABRICATING THE SAME

BACKGROUND

Semiconductor devices and integrated circuits used in a variety of electronic applications, such as cell phones and other electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1B:
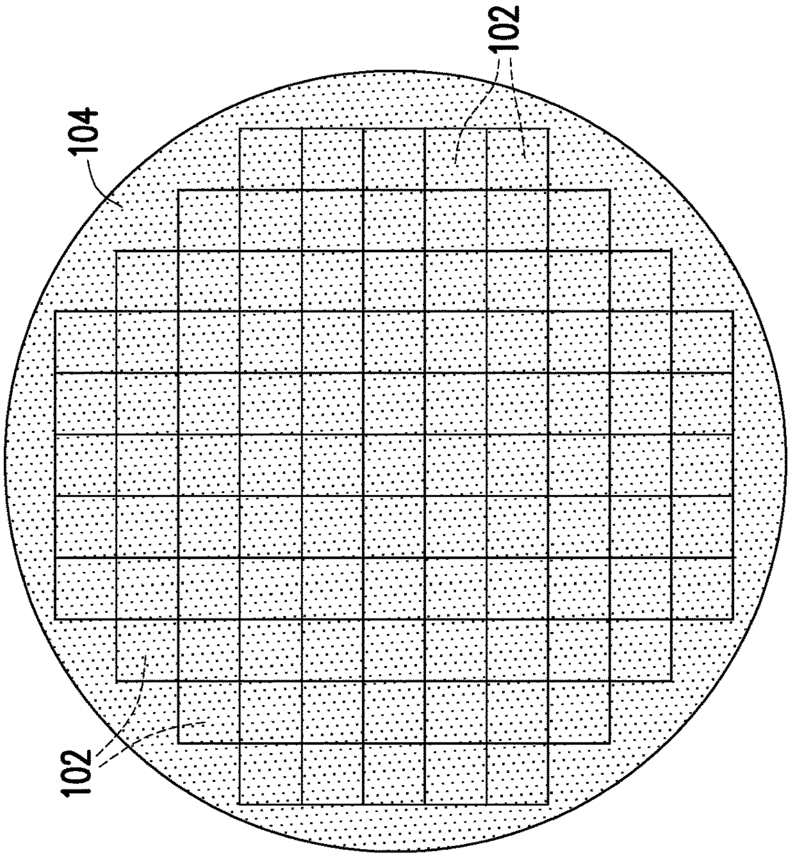
FIG. 1A to FIG. 13 are schematic top and sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “on”, “over”, “overlying”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1A:
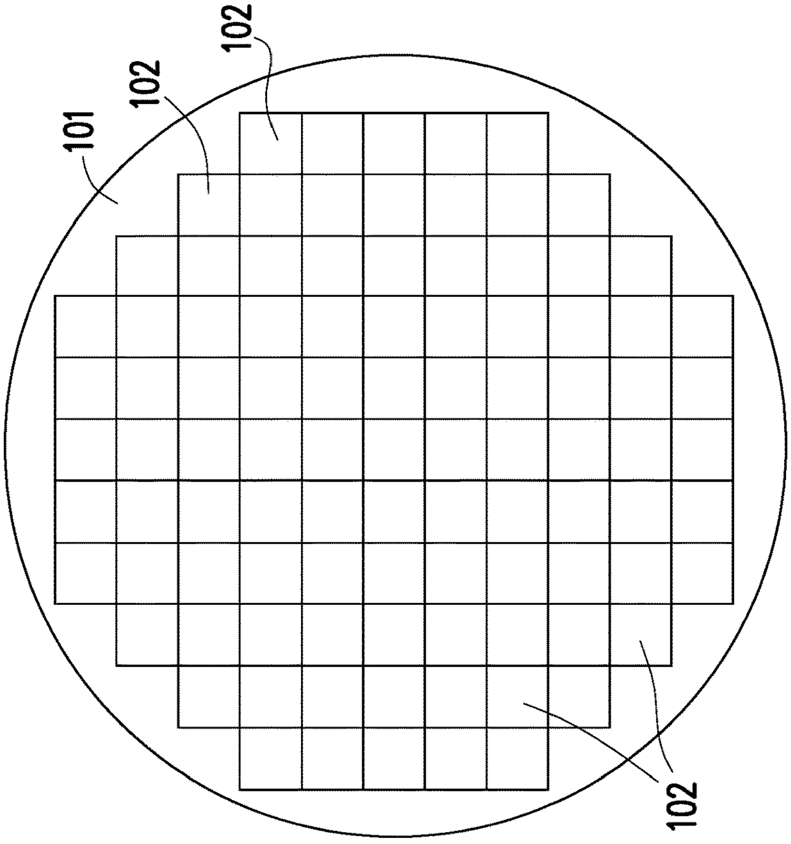

FIG. 1A to FIG. 13 are schematic top and sectional views of various stages in a method of fabricating a package structure according to some exemplary embodiments of the present disclosure. Referring to FIG. 1A, a semiconductor wafer 101 is provided. The semiconductor wafer 101 includes a plurality of semiconductor dies 102. Referring to FIG. 1B, in some embodiments, a die attach film layer 104 is formed on the semiconductor wafer 101 over backside surfaces of each of the semiconductor dies 102. In certain embodiments, the die attach film layer 104 is made from either thermoplastic or thermosetting polymer resins with conductive or non-conductive fillers. The die attach film 104 may be used as adhesives for attaching the semiconductor dies 102 to a carrier substrate in a subsequent step.

Figure 2:
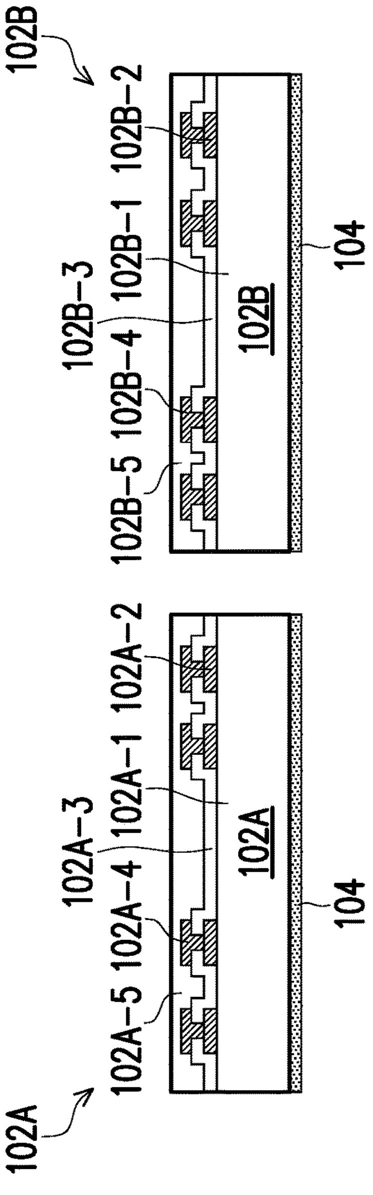

Referring to FIG. 2, in some embodiments, the semiconductor wafer 101 along with the die attach film layer 104 are sliced to separate individual semiconductor dies 102 (including 102A, 102B). For example, in the exemplary embodiment, at least a first semiconductor die 102A and a second semiconductor die 102B having die attach films 104 attached to backside surfaces thereof is obtained. In some embodiments, each of the first semiconductor die 102A and the second semiconductor die 102B includes a semiconductor substrate (102A-1/102B-1), a plurality of conductive pads (102A-2/102B-2), a passivation layer (102A-3/102B-3), a plurality of conductive pillars (102A-4/102B-4), and a protection layer (102A-5/102B-5).

As illustrated in FIG. 2, the plurality of conductive pads (102A-2/102B-2) is disposed on the semiconductor substrate (102A-1/102B-1). The passivation layer (102A-3/102B-3) is formed over the semiconductor substrate (102A-1/102B-1) and has openings that partially expose the conductive pads (102A-2/102B-2) on the semiconductor substrate (102A-1/102B-1). The semiconductor substrate (102A-1/102B-1) may be a bulk silicon substrate or a silicon-on-insulator (SOI) substrate, and further includes active components (e.g., transistors or the like) and optionally passive components (e.g., resistors, capacitors, inductors or the like) formed therein. The conductive pads (102A-2/102B-2) may be aluminum pads, copper pads or other suitable metal pads. The passivation layer (102A-3/102B-3) may be a silicon oxide layer, a silicon nitride layer, a silicon oxy-nitride layer or a dielectric layer formed of any suitable dielectric materials.

Furthermore, in some embodiments, a post-passivation layer (not shown) is optionally formed over the passivation layer (102A-3/102B-3). The post-passivation layer covers the passivation layer (102A-3/102B-3) and has a plurality of contact openings. The conductive pads (102A-2/102B-2) are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive pillars (102A-4/102B-4) are formed on the conductive pads (106B,107B) by plating. The conductive pillars (102A-4/102B-4) may be made of a first material, for example, the first material may be copper, or the like. In some embodiments, the protection layer (102A-5/102B-5) is formed on the passivation layer (102A-3/102B-3) or on the post passivation layer, and covering the conductive pillars (102A-4/102B-4) so as to protect the conductive pillars (102A-4/102B-4).

In some embodiments, the first semiconductor die 102A may be a logic device, such as a central processing unit (CPU), graphics processing unit (GPU), system-on-a-chip (SoC), microcontroller, or the like. The second semiconductor die 102B may be a memory device, such as a dynamic random access memory (DRAM) die, static random access memory (SRAM) die, hybrid memory cube (HMC) module, a high bandwidth memory (HBM) module, or the like. In some embodiments, the first semiconductor die 102A and the second semiconductor die 102B may be may be the same type of dies, such as SoC dies. The first semiconductor die 102A and the second semiconductor die 102B may have different sizes (e.g., different heights and/or surface areas), or may have the same size (e.g., same heights and/or surface areas).

Figure 3:
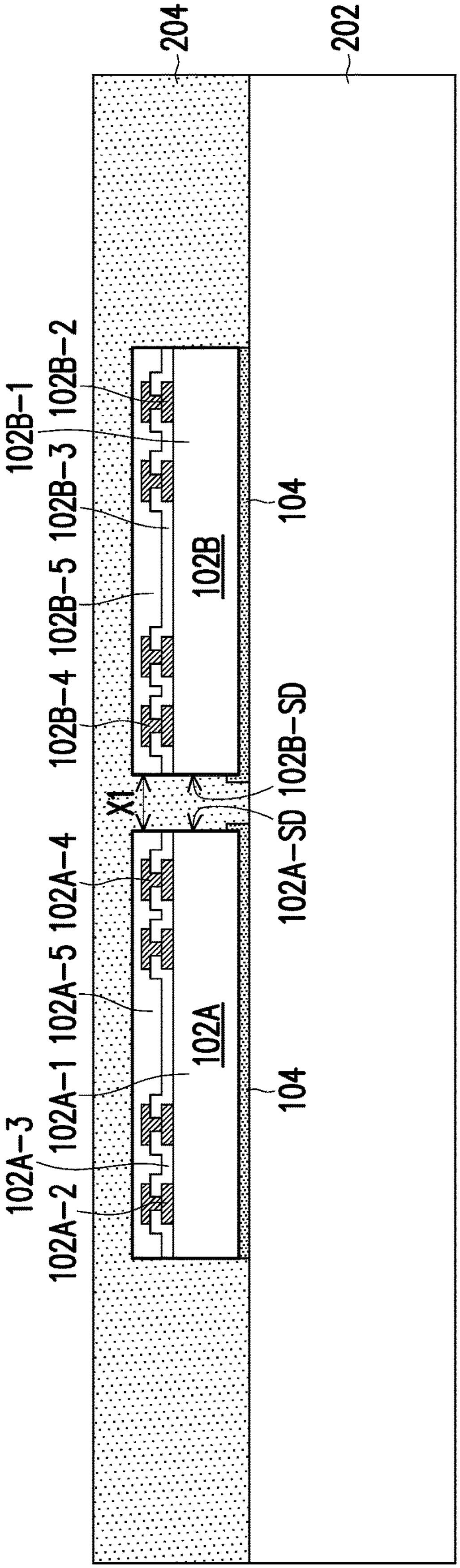

Referring to FIG. 3, the first semiconductor die 102A and the second semiconductor die 102B are placed on a carrier substrate 202. In one embodiment, the carrier substrate 202 may be a glass carrier or any suitable carrier for carrying a semiconductor wafer or a reconstituted wafer used in a method of fabricating the package structure. In some embodiments, a de-bonding layer (not shown) may be formed on the carrier substrate 202, whereby the first semiconductor die 102A and the second semiconductor die 102B may be placed on the de-bonding layer. In some embodiments, the de-bonding layer may be any material suitable for bonding and de-bonding the carrier substrate 202 from the above layer(s) or any wafer(s) disposed thereon. In some embodiments, the de-bonding layer may include a release layer (such as a light-to-heat conversion ("LTHC") layer) or an adhesive layer (such as an ultra-violet curable adhesive or a heat curable adhesive layer).

In some embodiments, after placing the first semiconductor die 102A and the second semiconductor die 102B over the carrier substrate 202 (or on the de-bonding layer), a portion of the die attach films 104 may be squeezed to partially cover side surfaces (102A-SD, 102B-SD) of the first semiconductor die 102A and the second semiconductor die 102B. In some embodiments, the first semiconductor die 102A is placed aside the second semiconductor die 102B over the carrier substrate 202 so that the first semiconductor die 102A and the second semiconductor die 102B are spaced apart by a first distance X1, whereby the first distance X1 is in a range of 100 μm to 200 μm.

In some embodiments, after placing the first semiconductor die 102A and the second semiconductor die 102B on the carrier substrate 202, an insulating material 204 is formed over the carrier substrate 202 to cover the first semiconductor die 102A and the second semiconductor die 102B. In some embodiments, the insulating material 204 is formed through, for example, a compression molding process, filling up the gaps between the first and second semiconductor dies (102A/102B) and encapsulating the first and second semiconductor dies (102A/102B). At this stage, the conductive pillars (102A-4/102B-4) and the protection layer (102A-5/102B-5) of the first and second semiconductor dies (102A/102B) are encapsulated by and well protected by the insulating material 204. In other words, the conductive pillars (102A-4/102B-4) and the protection layer (102A-5/102B-5) of the semiconductor dies (102A/102B) are not revealed and are well protected by the insulating material 204.

In some embodiments, the insulating material 204 for example, include polymers (such as epoxy resins, phenolic resins, silicon-containing resins, or other suitable resins), dielectric materials having low permittivity (Dk) and low loss tangent (Df) properties, or other suitable materials. In certain embodiments, the insulating material 204 may further include inorganic filler or inorganic compounds (e.g. silica, clay, and so on) which can be added therein to optimize coefficient of thermal expansion (CTE) of the insulating material 204. The disclosure is not limited thereto.

Figure 4:
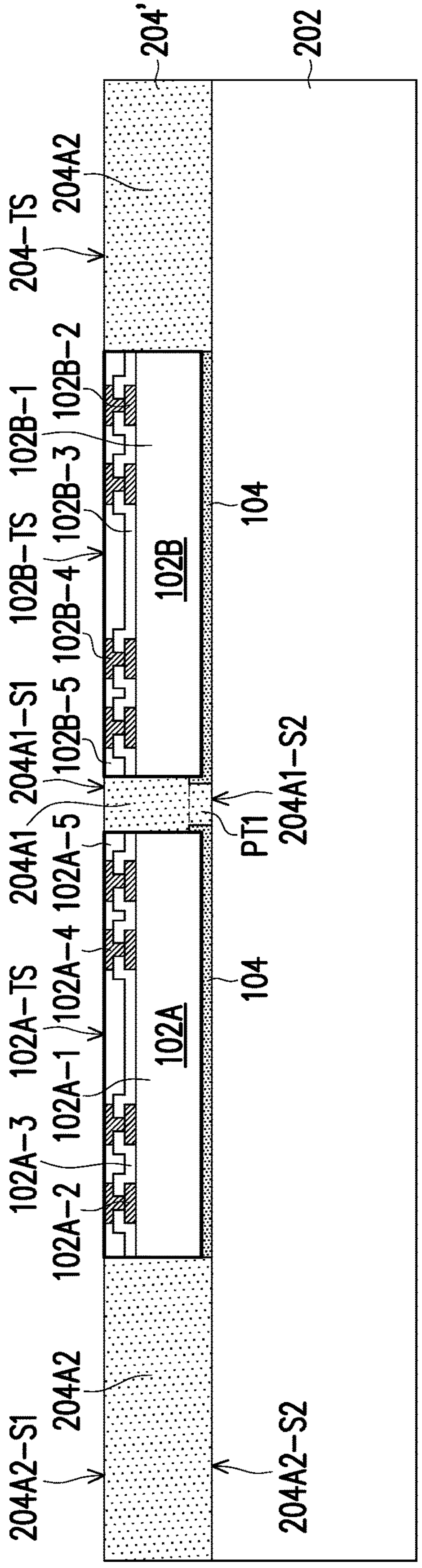

Referring to FIG. 4, in a subsequent step, the insulating material 204 is partially removed to expose the conductive pillars (102A-4/102B-4) of the first semiconductor die 102A and the second semiconductor die 102B. In some embodiments, the insulating material 204 and the protection layer (102A-5/102B-5) are ground or polished by a planarization step. For example, the planarization step is performed through a mechanical grinding process and/or a chemical mechanical polishing (CMP) process until the top surfaces of the conductive pillars (102A-4/102B-4) are revealed. In some embodiments, the insulating material 204 is polished to form an insulating encapsulant 204'. In some embodiments, after the planarization step, the top surfaces of the conductive pillars (102A-4/102B-4), the top surfaces (102A-TS/102B-TS) of the first semiconductor die 102A and the second semiconductor die 102B, and the top surface 204-TS of the insulating encapsulant 204' are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

In the exemplary embodiment, the insulating encapsulant 204' is formed with a first portion 204A1 and a second portion 204A2. The first portion 204A1 is a portion of the insulating encapsulant 204' sandwiched in between the first semiconductor die 102A and the second semiconductor die 102B, while the second portion 204A2 is a portion of the insulating encapsulant that laterally surrounds the first portion 204A1, and laterally surrounds the first semiconductor die 102A and the second semiconductor die 102B. In some embodiments, due to the presence of the die attach films 104 on sidewalls of the first semiconductor die 102A and the second semiconductor die 102B, the first portion 204A1 of the insulating encapsulant 204' includes a protruding part PT1. For example, the first portion 204A1 of the insulating encapsulant 204' has a first surface 204A1-S1 and a second surface 204A1-S2 opposite to the first surface 204A1-S1. The first surface 204A1-S1 of the first portion 204A1 is a planar surface, while the second surface 204A1-S2 of the first portion 204A1 includes the protruding part PT1. In some embodiments, a maximum width of the first portion 204A1 of the insulating encapsulant 204' measured from a side surface of the first semiconductor die 102A to a side surface of the second semiconductor die 102B is in a range of 100 μm to 200 μm. In some embodiments, the second portion 204A2 surrounding the first portion 204A1 has a third surface 204A2-S1 and a fourth surface 204A2-S2 opposite to the third surface 204A2-S1, whereby the third surface 204A2-S1 and the fourth surface 204A2-S2 are planar surfaces. In some embodiments, the fourth surface 204A2-S2 of the second portion 204A2 is substantially levelled with the second surface 204A1-S2 of the first portion 204A1 including the protruding part PT1.

Figure 5:
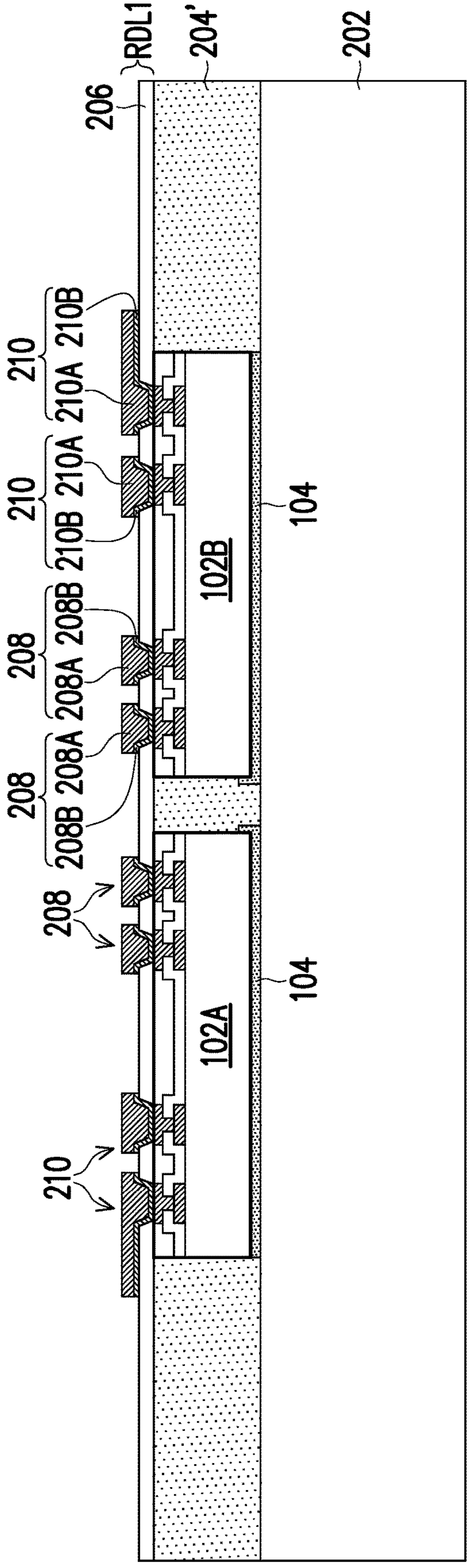

Referring to FIG. 5, in a subsequent step, a redistribution layer RDL1 may be formed on the insulating encapsulant 204', and over the first semiconductor die 102A and the second semiconductor die 102B. In some embodiments, forming the redistribution layer RDL1 includes forming a dielectric layer 206 disposed on the insulating encapsulant 204', and forming first conductive features 208 and second conductive features 210 on the dielectric layer 206. In some embodiments, the dielectric layer 206 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, chemical vapor deposition (CVD), or the like. Other acceptable dielectric materials formed by any acceptable process may be used. In some embodiments, the dielectric layer 204 may be patterned to form openings revealing the conductive pillars (102A-4/102B-4) of the first semiconductor die 102A and second semiconductor die 102B.

In some embodiments, the first conductive features 208 and the second conductive features 210 are formed on the dielectric layer 206, and fill into the openings of the dielectric layer 206. For example, the first conductive features 208 and the second conductive features 210 are electrically connected to the conductive pillars (102A-4/102B-4) of the first semiconductor die 102A and second semiconductor die 102B. In some embodiments, forming the first conductive features 208 and the second conductive features 210, includes forming seed layer portions 208B, 210B and forming conductive body portions 208A, 210A. For example, a seed layer (not shown) is conformally formed over the dielectric layer 206 and within the openings of the dielectric layer 206. Thereafter, a conductive material may be formed over the seed layer, whereby the seed layer is patterned to form the seed layer portions 208B, 210B, and the conductive material is patterned to form the conductive body portions 208A, 210A. In some embodiments, the seed layer portions 208B are sandwiched in between the conductive pillars (102A-4/102B-4) and the conductive body portions 208A, while the seed layer portions 210B are sandwiched in between the conductive pillars (102A-4/102B-4) and the conductive body portions 210A. In some embodiments, the seed layer portions 208B, 210B are formed by electroless plating, chemical vapor deposition (CVD), physical vapor deposition (PVD), atomic layer deposition (ALD), high density plasma CVD (HDPCVD) or combinations thereof. In one embodiment, the seed layer portions 208B, 210B are formed by sequentially depositing or sputtering a titanium layer and a copper layer. In some embodiments, the conductive body portions 208A, 210A are formed by plating, such as electroless plating or electroplating, or the like, and may be formed of material such as copper, titanium, tungsten, aluminum, or the like.

Figure 6:
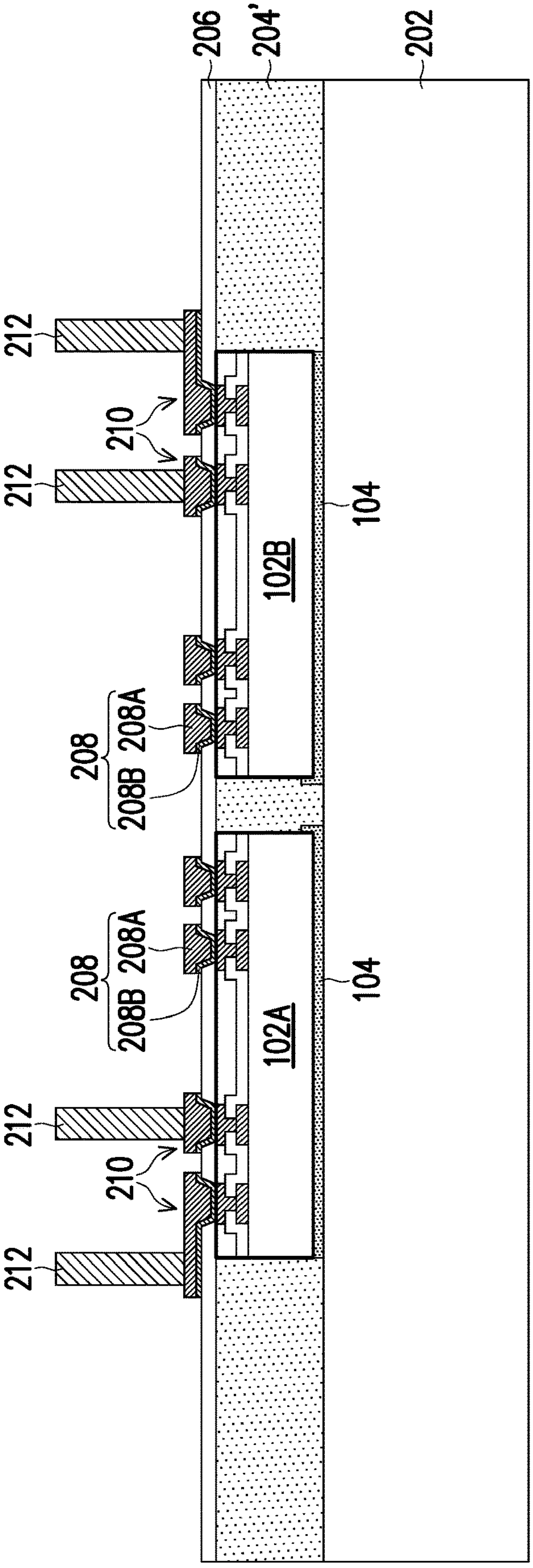

Referring to FIG. 6, in a subsequent step, a plurality of through vias 212 may be formed on the second conductive features 210. For example, the through vias 212 are disposed on and electrically connected to the conductive body portions 210A of the second conductive features 210. In some embodiments, the formation of the through vias 212 includes forming a mask pattern (not shown) with openings, then forming a metallic material (not shown) filling up the openings by electroplating or deposition, and removing the mask pattern to form the through vias 212. In some embodiments, the through vias 212 are made of a metal material such as copper or copper alloys, or the like.

Figure 7:
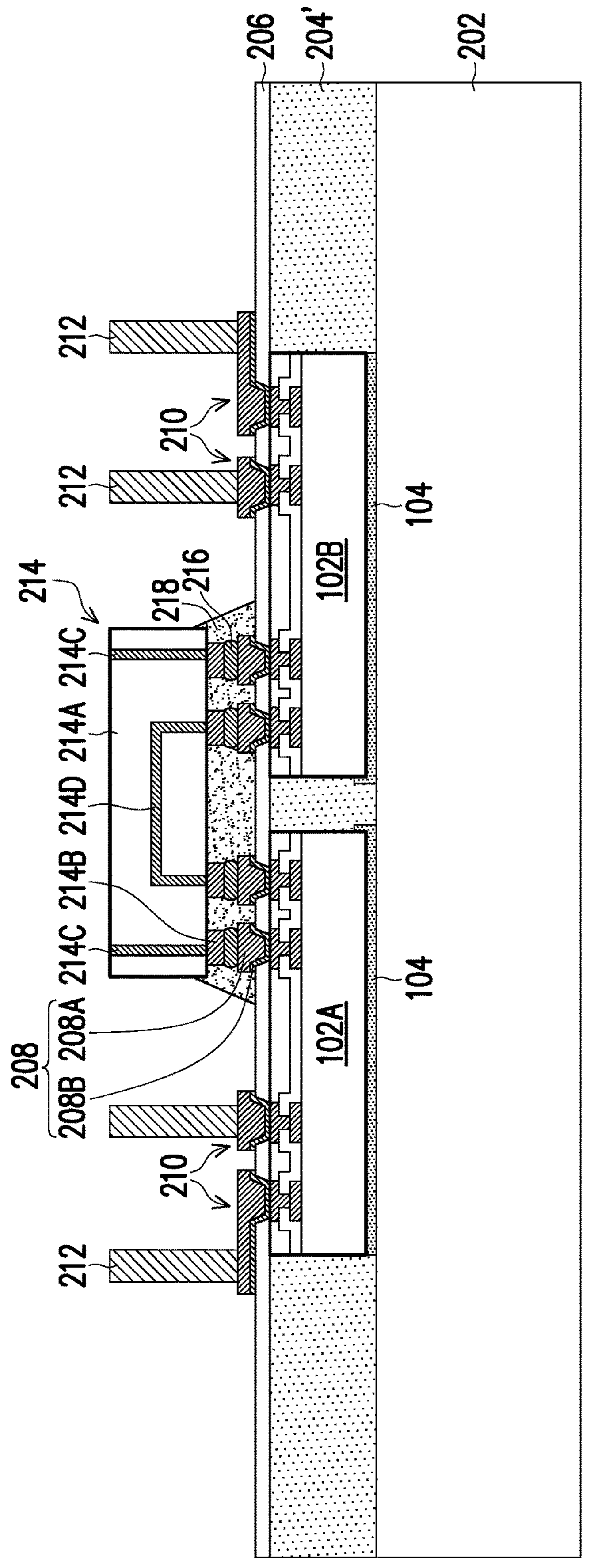
Figure 8:
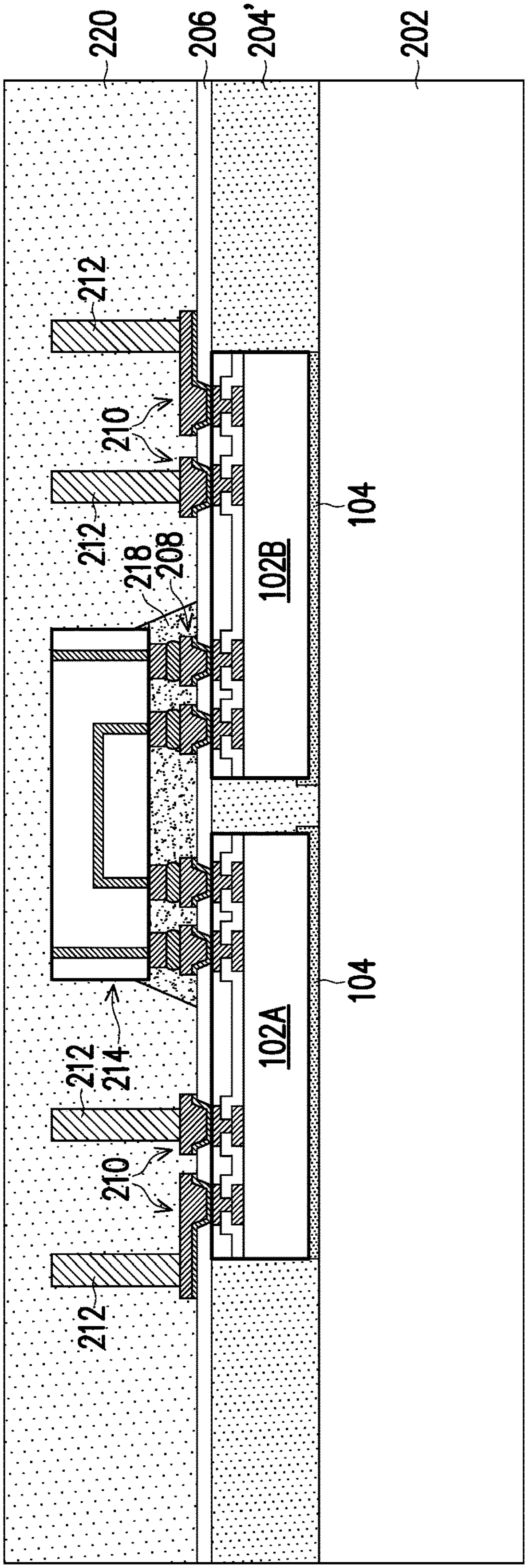

Referring to FIG. 7, after forming the through vias 212, a bridge structure 214 is disposed on the first conductive features 208 to be electrically connected to the conductive body portions 208A of the first conductive features 208. The bridge structure 214 may be local silicon interconnects (LSIs), large scale integration packages, interposer dies, or the like. In some embodiments, the bridge structure 214 is partially overlapped with the first semiconductor die 102A and the second semiconductor die 102B. In some embodiments, the bridge structure 214 includes a substrate 214A, connection structures 214B, through substrate vias 214C and die bridges 214D. The substrate 214A may be semiconductor substrates, dielectric layers, or the like. The through substrate vias 214C extend through the substrate 214A, and are exposed at back sides of the bridge structure 214. The die bridges 214D may be metallization layer that are formed in the substrate 214A, and are electrically connecting the first semiconductor die 102A to the second semiconductor die 102B. As such, the bridge structure 214 can be used to directly connect and allow communication between the semiconductor dies (102A/102B). The connection structures 214B are disposed on the substrate 214A and are electrically connected to the through substrate vias 214C and the die bridges 214D.

In some embodiments, conductive connectors 216 are provided in between the first conductive features 208 and the connection structures 214B of the bridge structure 214. In some embodiments, a reflow process is performed so that the conductive connectors 216 are electrically connected to the first conductive features 208 and the connection structures 214B. In certain embodiments, the bridge structure 214 is electrically connected to the first semiconductor die 102A and the second semiconductor die 102B through the conductive connectors 216 and the first conductive features 208.

In the exemplary embodiment, the conductive connectors 216 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 216 may include a conductive material such as solder, copper, aluminum, gold, nickel, silver, palladium, tin, the like, or a combination thereof. In some embodiments, the conductive connectors 216 are formed by initially forming a layer of solder through evaporation, electroplating, printing, solder transfer, ball placement, or the like. Once a layer of solder has been formed on the structure, a reflow process may be performed in order to shape the material into the desired bump shapes, and so that the conductive connectors 216 are joined with the first conductive features 208 and the connection structures 214B.

After placing the bridge structure 214 on the first conductive features 208, an underfill structure 218 may be formed to fill up the gaps in between the bridge structure 214 and the redistribution layer RDL1. For example, the underfill structure 218 covers and surrounds the connection structures 214B, the conductive connectors 216 and the conductive body portions 208A of the first conductive features 208. The underfill structure 218 may reduce stress and protect the joints resulting from the reflowing of the conductive connectors 216. The underfill 218 may be formed of a molding compound, epoxy, or the like. The underfill 218 may be formed by a capillary flow process after the bridge structure 214 is attached, or may be formed by a suitable deposition method before the bridge structure 214 is attached. The underfill 218 may be applied in liquid or semi-liquid form and then subsequently cured.

Figure 9:
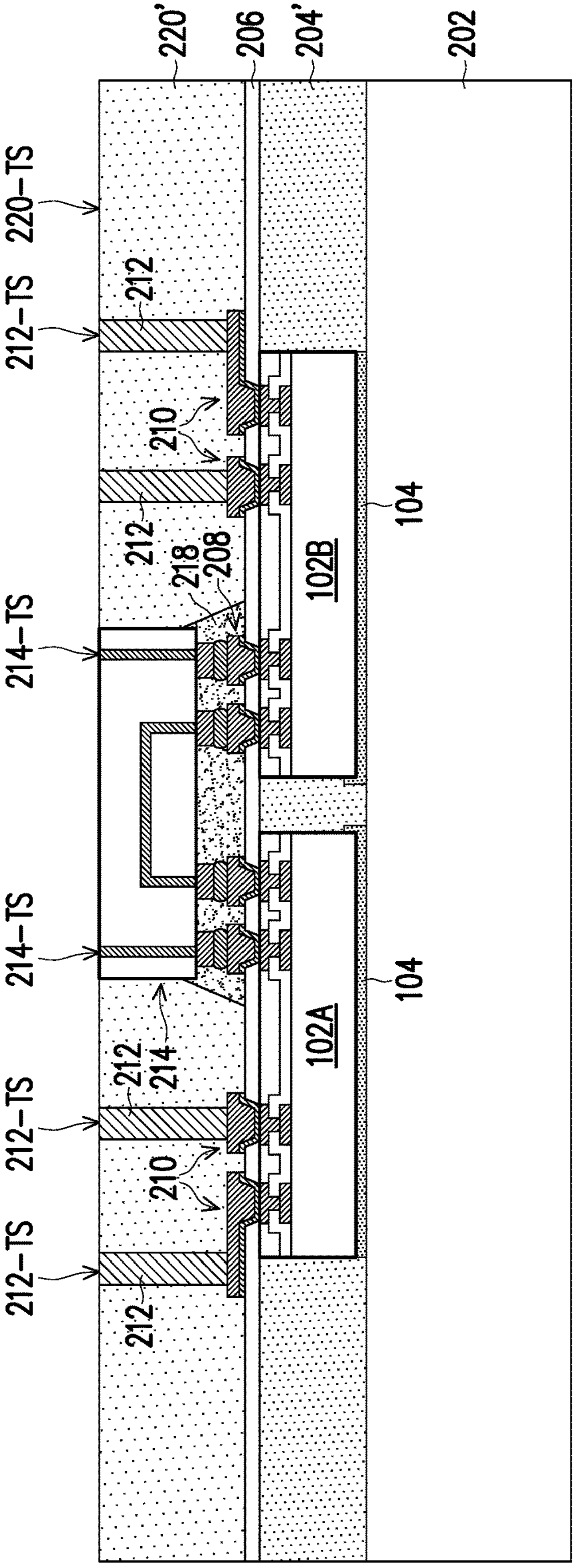

Referring to FIG. 9, after performing the reflow process to join the conductive connectors 216 to the connection structures 214B and the first conductive features 208, an insulating material 220 is formed over the dielectric layer 206 and the insulating encapsulant 204', and formed to encapsulate the bridge structure 214 and the through vias 212. In some embodiments, the insulating material 220 is formed through, for example, a compression molding process, filling up the gaps between the bridge structure 214 and adjacent through vias 212. At this stage, the bridge structure 214 and the through vias 212 are encapsulated and well protected by the insulating material 204'.

In some embodiments, the insulating material 220 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 220 may include an acceptable insulating encapsulation material. In some embodiments, the insulating material 220 may further include inorganic filler or inorganic compound (e.g. silica, clay, and so on) which can be added therein to optimize coefficient of thermal expansion (CTE) of the insulating material 220. In certain embodiments, the insulating material 220 may be the same or different than the insulating material 204. The disclosure is not limited thereto.

Referring to FIG. 9, in a subsequent step, a thinning step is performed to form an insulating encapsulant 220'. For example, the thickness of the insulating material 220 is reduced until top surfaces 212-TS of the through vias 212 and top surfaces 214-TS of the through substrate vias 214C are revealed. In certain embodiments, the insulating material 220 is ground or polished by a mechanical grinding process and/or a chemical mechanical polishing (CMP) process to form the insulating encapsulant 220'. In some embodiments, the through vias 212 may be partially polished so that the top surfaces 212-TS of the through vias 212 are levelled with the top surfaces 214-TS of the through substrate vias 214C. In some embodiments, the top surface 220-TS of the insulating encapsulant 220', the top surface 212-TS of the through insulator vias 212, and the top surfaces 214-TS of the through substrate vias 214C are coplanar and levelled with one another.

Figure 10:
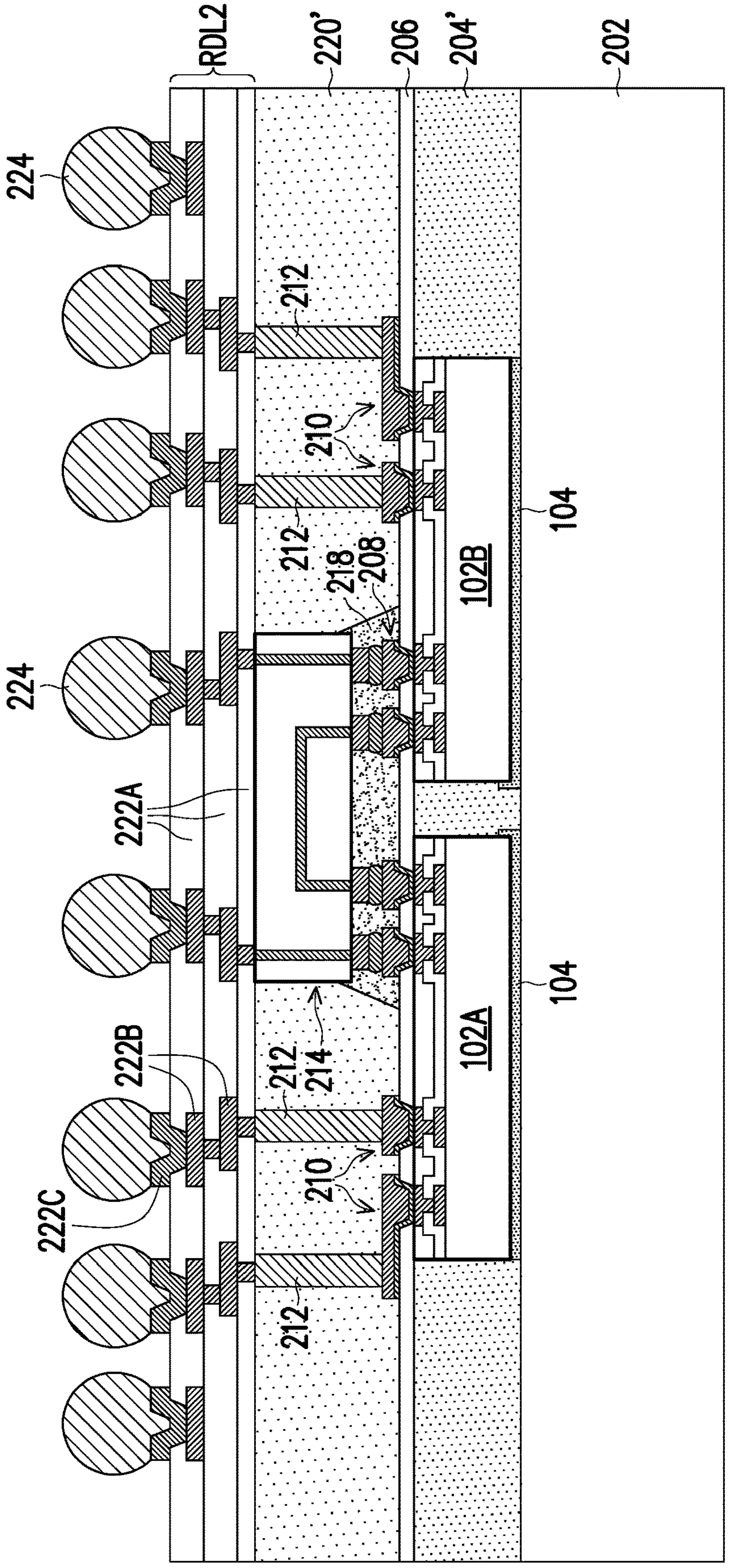

Referring to FIG. 10, after the thinning step, a redistribution layer RDL2 is formed on the insulating encapsulant 220' over the bridge structure 214 and the through vias 212. In some embodiments, the redistribution layer RDL2 may include a plurality of dielectric layers 222A and a plurality of conductive elements 222B alternately stacked. Although only two layers of the conductive elements 222B and three layers of dielectric layers 222A are illustrated herein, however, the scope of the disclose is not limited by the embodiments of the disclosure. In other embodiments, the number of conductive elements 222B and the dielectric layers 222A may be adjusted based on product requirement. In some embodiments, the conductive elements 222B are electrically connected to the first semiconductor die 102A and the second semiconductor die 102B through the through vias 212. In certain embodiments, the conductive elements 222B are electrically connected to the through substrate vias 214C of the bridge structure 214.

In some embodiments, the material of the dielectric layers 222A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 222A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive elements 222B may be made of conductive materials formed by electroplating or deposition, such as aluminum, titanium, copper, nickel, tungsten, and/or alloys thereof, which may be patterned using a photolithography and etching process. In some embodiments, the conductive elements 222B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer RDL2, a plurality of conductive pads 222C may be disposed on an exposed top surface of the topmost layer of the conductive elements 222B for electrically connecting with conductive terminals (e.g. conductive balls). In certain embodiments, the conductive pads 222C are for example, under-ball metallurgy (UBM) patterns used for ball mount. As shown in FIG. 10, the conductive pads 222C are formed on and electrically connected to the redistribution layer RDL2. In some embodiments, the materials of the conductive pads 222C may include copper, nickel, titanium, tungsten, or alloys thereof or the like, and may be formed by an electroplating process, for example. The number of conductive pads 222C are not limited in this disclosure, and may be selected based on the design layout. In some alternative embodiments, the conductive pads 222C may be omitted. In other words, conductive terminals 224 formed in subsequent steps may be directly disposed on the redistribution layer RDL2.

As illustrated in FIG. 10, after forming the conductive pads 222C, a plurality of conducive terminals 224 are disposed on the conductive pads 222C and over the redistribution layer RDL2. In some embodiments, the conductive terminals 224 may be disposed on the conductive pads 222C by ball placement process or reflow process. In some embodiments, the conductive terminals 224 are, for example, solder balls, ball grid array (BGA) balls, or controlled collapse chip connection (C4) bumps. In some embodiments, the conductive terminals 224 are connected to the redistribution layer RDL2 through the conductive pads 222C. In certain embodiments, some of the conductive terminals 224 may be electrically connected to the semiconductor dies (102A/102B) through the redistribution layer RDL2. The number of the conductive terminals 224 is not limited to the disclosure, and may be designated and selected based on the number of the conductive pads 222C.

Figure 11A:
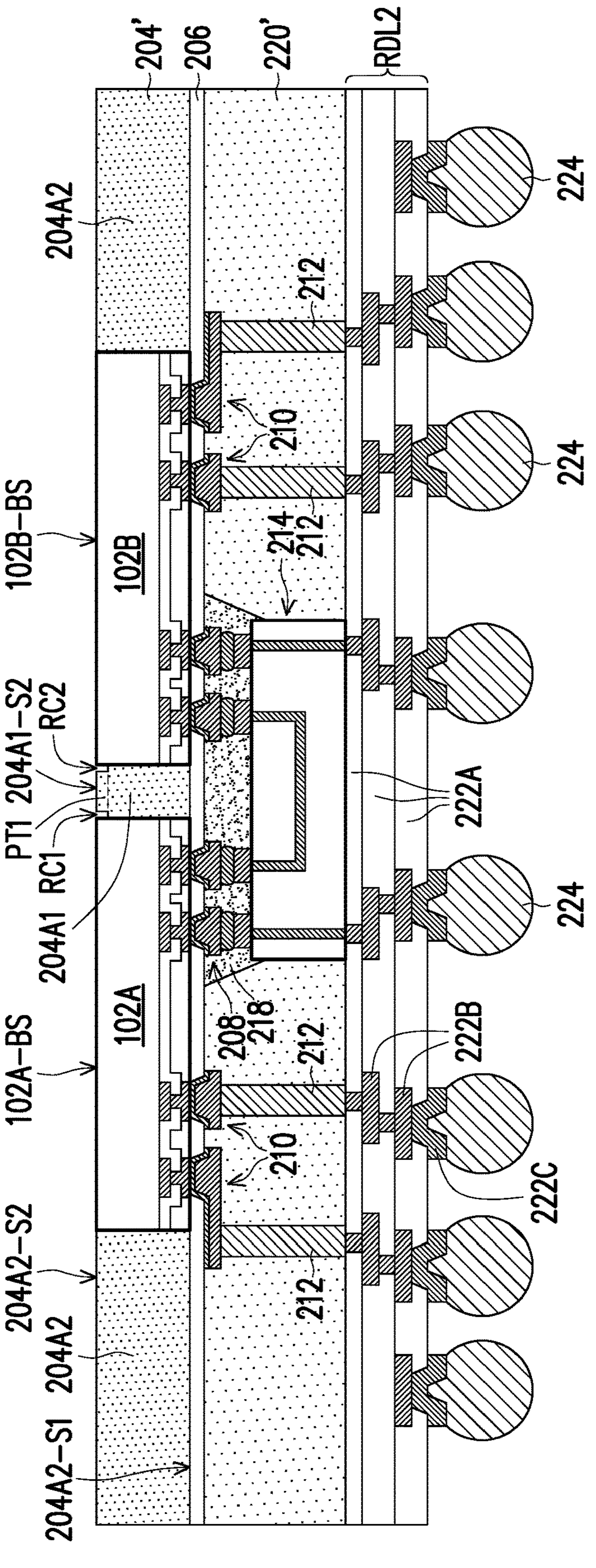
Figure 11B:
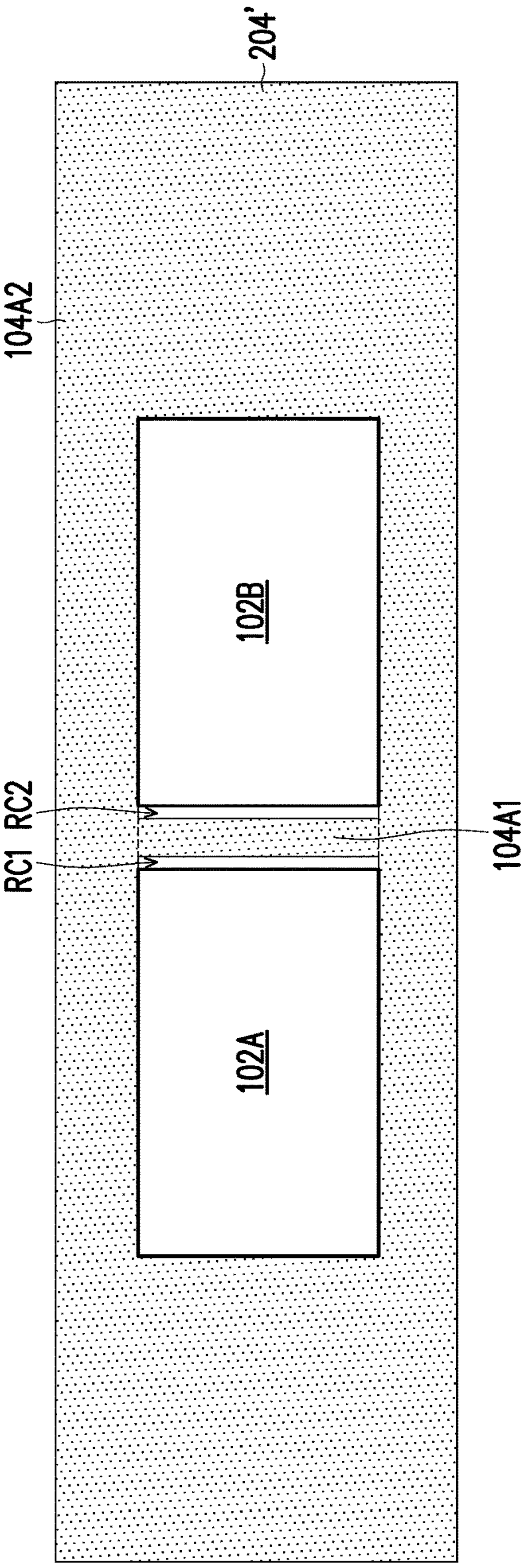

Referring to FIG. 11A and FIG. 11B, after forming the redistribution layer RDL2 and placing the conductive terminals 224 thereon, the structure shown in FIG. 10 is turned upside down and attached to a tape supported by a frame (not shown). In some embodiments, the carrier substrate 202 is debonded so as to separate the first semiconductor die 102A and the second semiconductor die 102B from the carrier substrate 202. In some embodiments, the de-bonding process include projecting a light such as a laser light or an UV light on the de-bonding layer, so that the carrier substrate 202 can be easily removed. In certain embodiments, the die attach films 104 attached to the backside surfaces of the first semiconductor die 102A and the second semiconductor die 102B are removed as well. As illustrated in FIG. 11A, and from a top view of the structure of FIG. 11A shown in FIG. 11B, upon removing the die attach films 104, the first portion 204A1 of the insulating encapsulant 204' sandwiched in between the first semiconductor die 102A and the second semiconductor die 102B is formed with a first recessed part RC1 adjacent to an edge of the first semiconductor die 102A, and is formed with a second recessed part RC2 adjacent to an edge of the second semiconductor die 102B. For example, the protruding part PT1 is located in between the first recessed part RC1 and the second recessed part RC2.

In the exemplary embodiment, due to the presence of the first recessed part RC1 and the second recessed part RC2 located at edges of the first semiconductor die 102A and the second semiconductor die 102B, the die to die bending strength of the first portion 204A1 of the insulating encapsulant 204' can be improved. As such, a molding crack issue of the insulating encapsulant 204' surrounding the first semiconductor die 102A and the second semiconductor die 102B may be resolved.

Figure 12:
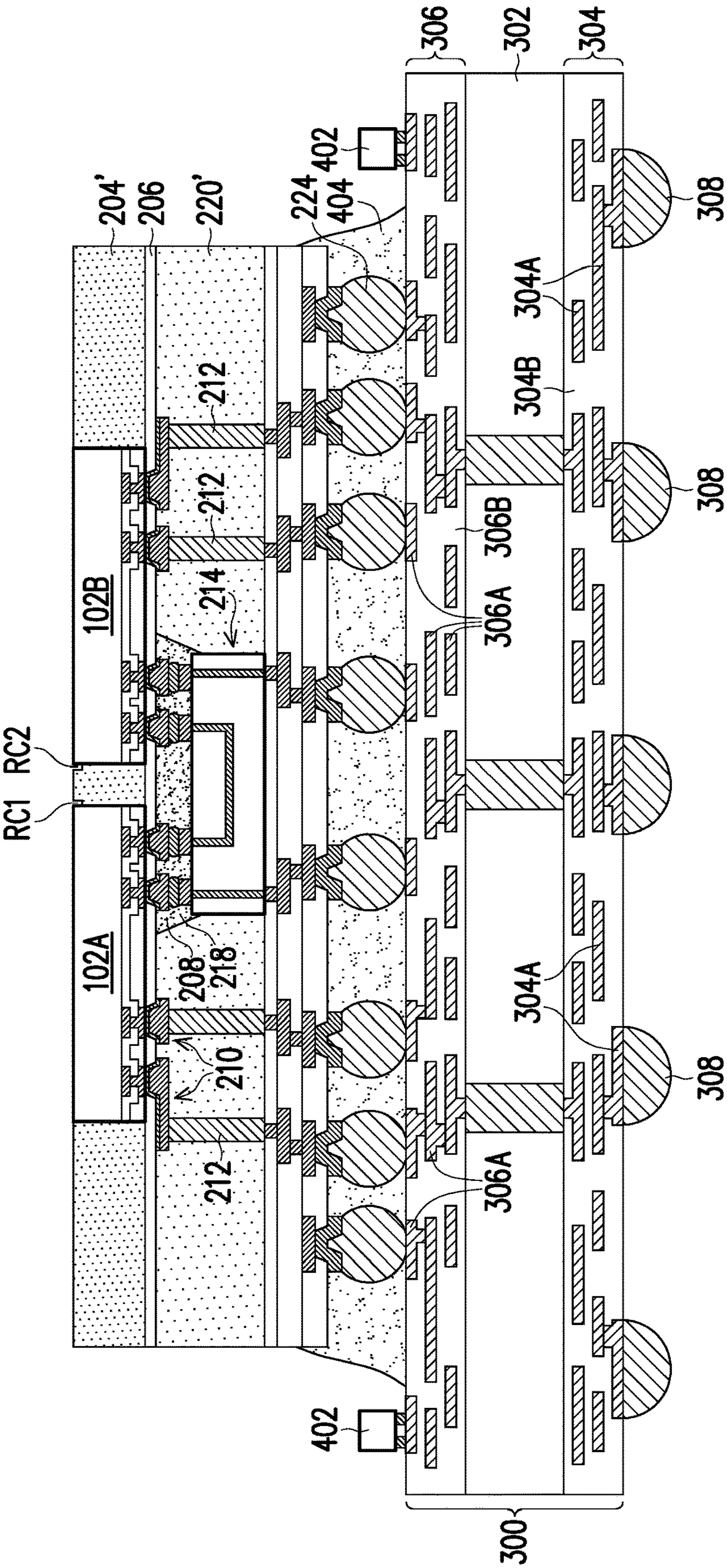

Referring to FIG. 12, in a subsequent step, the structure shown in FIG. 11A is attached to a circuit substrate 300 using the conductive terminals 224. The circuit substrate 300 may be an interposer, a printed circuit board (PCB), or the like. In the illustrated embodiment, the circuit substrate 300 includes a substrate core 302, a first redistribution structure 304 and a second redistribution structure 306 located on two opposing sides of the substrate core 302. The substrate core 302 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a silicon-on-insulator (SOI) substrate. Generally, an SOI substrate includes a layer of a semiconductor material such as epitaxial silicon, germanium, silicon germanium, SOI, SiGe-on-insulator (SGOI), or combinations thereof. In one alternative embodiment, the substrate core 302 is based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto Build-up Film (ABF) or other laminates may be used for substrate core 302.

In some embodiments, the substrate core 302 may include active and/or passive devices (not separately illustrated). A wide variety of devices such as transistors, capacitors, resistors, combinations of these, and the like may be used to generate the structural and functional designs for the device stack. The devices may be formed using any suitable methods.

In some embodiments, the first redistribution structure 304 and the second redistribution structure 306 disposed on the substrate core 302 includes a plurality of metallization layers 304A, 306A and a plurality of dielectric layers 304B, 306B surrounding the metallization layers 304A, 306A. The metallization layers 304A, 306A may be formed of a conductive material (e.g., copper), while the dielectric layers 304B, 306B may be formed by low-k dielectric material, or any suitable dielectric materials. In some embodiments, the metallization layers 304A of the first redistribution structure 304 is electrically connected to the metallization layers 306A of the second redistribution structure 306 through via structures embedded in the substrate core 302. In some embodiments, conductive connectors 308 are reflowed to the metallization layers 304A of the first redistribution structure 304, while the conductive terminals 224 are electrically connected to the metallization layers 306A of the second redistribution structure 306.

Furthermore, an underfill 404 may be formed between the redistribution layer RDL2 and the second redistribution structure 306 to laterally surround the conductive connectors 308 and to reduce stress and protect the joints resulting from the reflowing the conductive connector 308. In some embodiments, the underfill 404 is formed by a capillary flow process after the top package (including the first and second semiconductor dies 102A, 102B, the bridge structure 214, and the redistribution layer RDL2) is attached or is formed by a suitable deposition method before the top package is attached. In certain embodiments, the underfill 404 may partially cover the sidewalls of the redistribution layer RDL2.

In some embodiments, passive devices 402 (e.g., surface mount devices (SMDs)) may be mounted onto the circuit substrate 300. For example, the passive devices 402 may be disposed on and electrically connected to the second redistribution structure 306. In some embodiments, the passive devices 402 are bonded to the same surfaces of the second redistribution structure 306 as the conductive terminals 224. In certain embodiments, the passive devices 402 are spaced apart from the conductive terminals 224 and the underfill 404.

Figure 13:
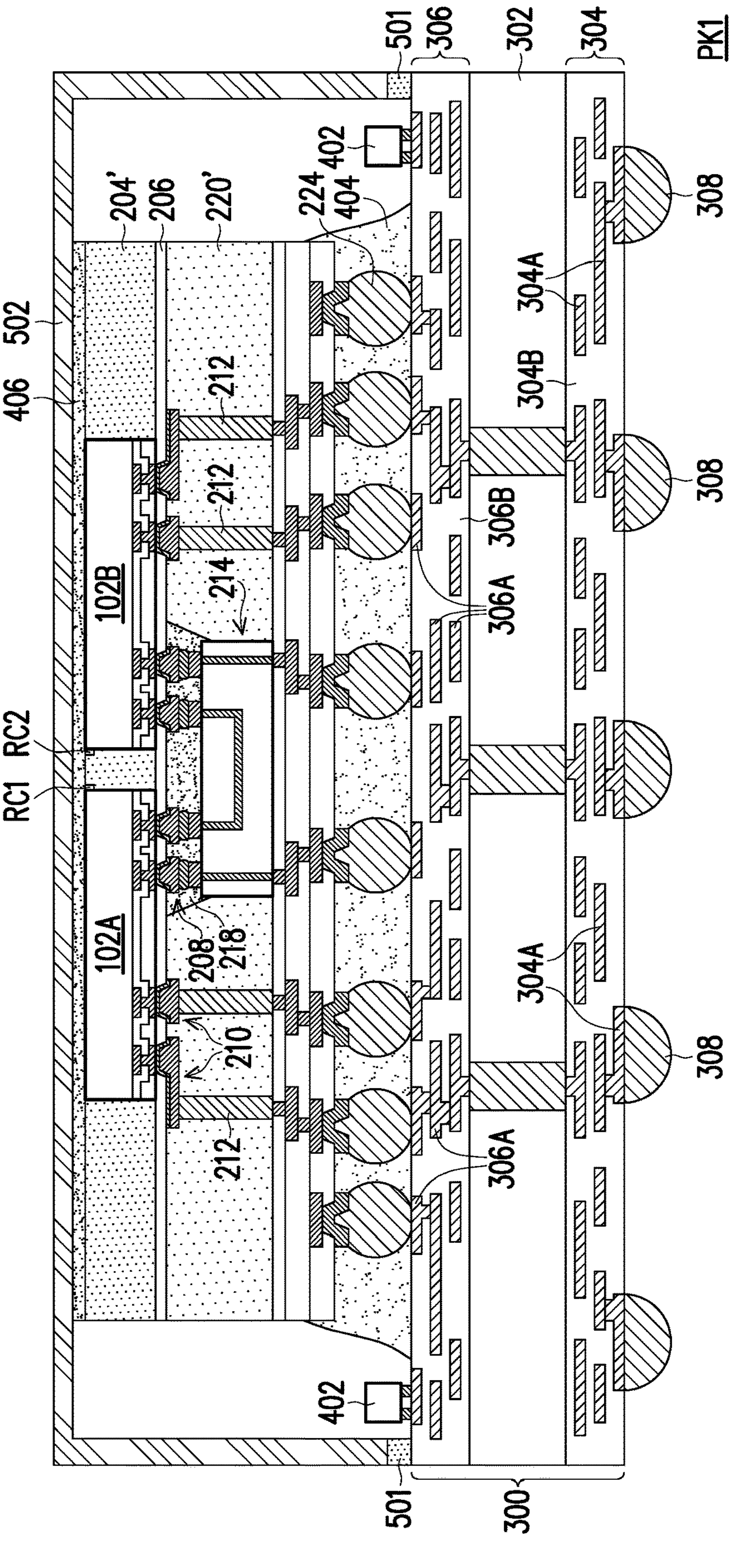

Referring to FIG. 13, after mounting the passive devices 402, a thermal interface material 406 is disposed on backside surfaces of the first semiconductor die 102A and the second semiconductor die 102B. In some embodiments, the thermal interface material 406 may fill into the first recessed part RC1 and the second recessed part RC1, but the disclosure is not limited thereto. In alternative embodiments, the thermal interface material 406 does not fill into the first recessed part RC1 and the second recessed part RC1. In some embodiments, after disposing the thermal interface material 406, a lid structure 502 is attached onto the circuit substrate 300 through an adhesive material 501. For example, the lid structure 502 is pressed onto the thermal interface material 406 so that the thermal interface material 406 is sandwiched in between the lid structure 502 and the backside surfaces of the first semiconductor die 102A and the second semiconductor die 102B. In some embodiments, the lid structure 502 is disposed to surround the first and second semiconductor dies 102A, 102B, the bridge structure 214, and the redistribution layer RDL2. Up to here, a package structure PK1 according to some exemplary embodiments of the present disclosure is accomplished.

In the package structure PK1 illustrated in FIG. 13, the insulating encapsulant 204' is formed with a first recessed part RC1 and the second recessed part RC2 located at edges of the first semiconductor die 102A and the second semiconductor die 102B. As such, a molding crack issue of the insulating encapsulant 204' surrounding the first semiconductor die 102A and the second semiconductor die 102B may be resolved.

The details of the arrangement of the thermal interface material 406 relative to the first recessed part RC1 and the second recessed part RC1 of the first portion 204A1 of the insulating encapsulant 204' shown in FIG. 13 will be described in further details by referring to FIG. 14A to FIG. 14E.

Figures 14A, 14B, 14C, 14D, 14E:
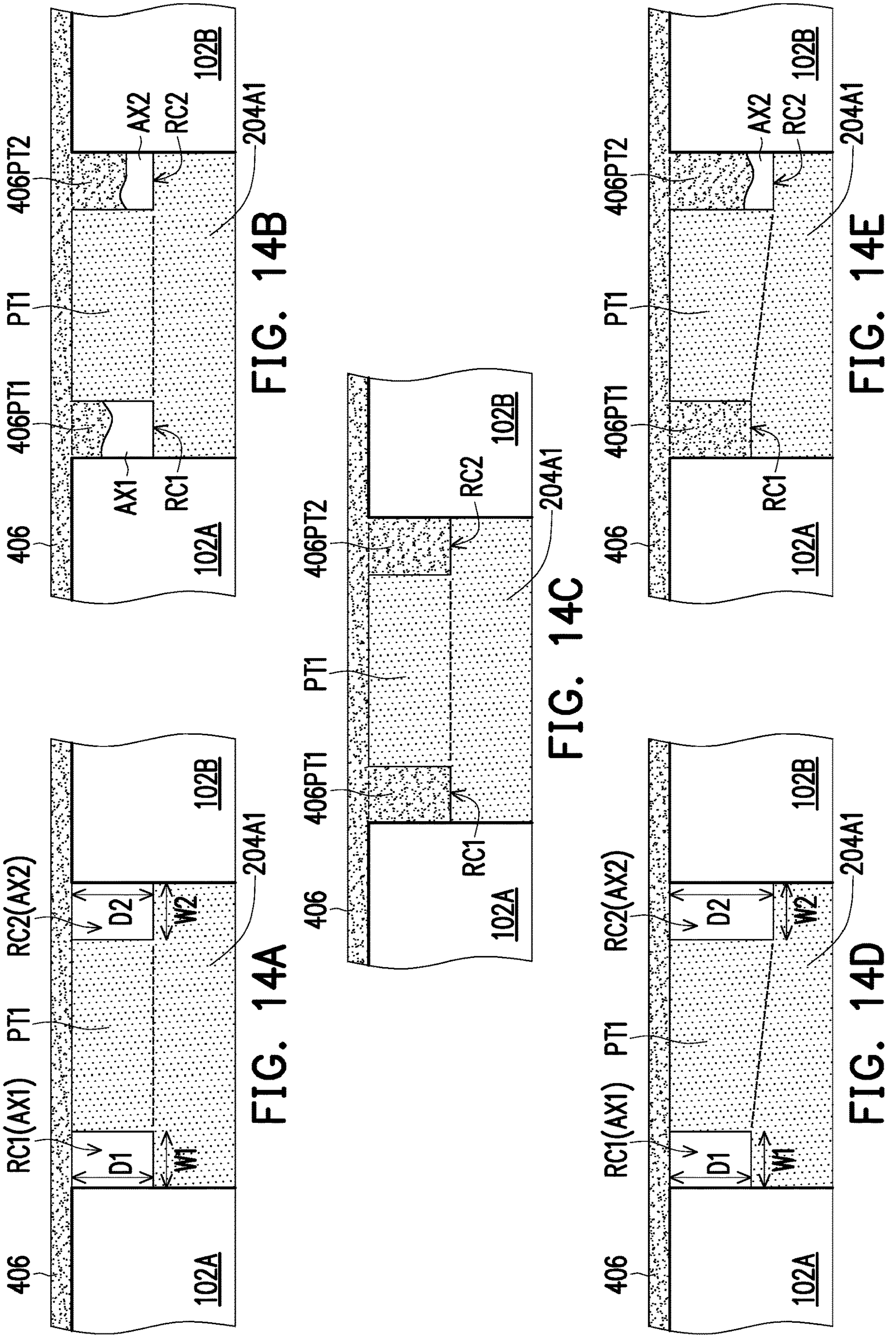
FIG. 14A and FIG. 14E are enlarged sectional views of a first portion of an insulating encapsulant in a package structure in accordance with various embodiments of the present disclosure.

FIG. 14A and FIG. 14E are enlarged sectional views of the first portion 204A1 of an insulating encapsulant 204' in a package structure in accordance with various embodiments of the present disclosure. As illustrated in FIG. 14A, in some embodiments, the first portion 204A1 of the insulating encapsulant 204' is shown to include a first recessed part RC1 and a second recessed part RC2. The protruding part PT1 is located in between the first recessed part RC1 and the second recessed part RC2. In some embodiments, the first recessed part RC1 has a depth of D1 and a width of W1, while the second recessed part RC2 has a depth of D2 and a width of W2. In some embodiments, the depth D1 of the first recessed part RC1 and the depth D2 of the second recessed part RC2 is in a range of 1 μm to 10 μm. In certain embodiments, the depth D1 of the first recessed part RC1 and the depth D2 of the second recessed part RC2 is in a range of 5 μm to 10 μm. In the exemplary embodiment, the depth D1 and width W1 of the first recessed part RC1 is substantially equal to the depth D2 and the width W2 of the second recessed part RC2. In some embodiments, a height of the protruding part PT1 of the first portion 204A1 is substantially equal to the depth D1 of the first recessed part RC1 or the depth D2 of the second recessed part RC2. In other words, the height of the protruding part PT1 may also be in a range of 1 μm to 10 μm.

As further illustrated in FIG. 14A, after disposing the thermal interface material 406 on the on the backside surfaces of the first semiconductor die 102A and the second semiconductor die 102B, the thermal interface material 406 does not fill into the first recessed part RC1 and the second recessed part RC2. In other words, air spaces AX1, AX2 are located in between the protruding part PT1 of the first portion 204A1 of the insulating encapsulant 204' and edges of the first and second semiconductor dies 102A, 102B.

As further illustrated in FIG. 14B, in another embodiment, the thermal interface material 406 partially fills into the first recessed part RC1 and the second recessed part RC2 of the insulating encapsulant 204'. In other words, the thermal interface material 406 includes a first protruding part 406PT1 and a second protruding part 406PT2 that is partially covering side surfaces of the first and second semiconductor dies 102A, 102B. In some embodiments, a protruding height of the first protruding part 406PT1 may be different from a protruding height of the second protruding part 406PT2. Furthermore, since the thermal interface material 406 does not completely fill into the first recessed part RC1 and the second recessed part RC2, air spaces AX1, AX2 are still located in between the protruding part PT1 of the first portion 204A1 of the insulating encapsulant 204' and edges of the first and second semiconductor dies 102A, 102B.

As further illustrated in FIG. 14C, in another embodiment, the thermal interface material 406 completely fills into first recessed part RC1 and the second recessed part RC2 of the insulating encapsulant 204'. In other words, the first protruding part 406PT1 and the second protruding part 406PT2 fills up the first recessed part RC1 and the second recessed part RC2 of the insulating encapsulant 204', and contact side surfaces of the protruding part PT1. As further illustrated in FIG. 14D, in some other embodiments, the thermal interface material 406 does not fill into the first recessed part RC1 and the second recessed part RC2 of the insulating encapsulant. However, the depth D1 and width W1 of the first recessed part RC1 may be different from the depth D2 and the width W2 of the second recessed part RC2. For example, the depth D2 and the width W2 of the second recessed part RC2 may be larger than the depth D1 and the width W1 of the first recessed part RC1.

As illustrated in FIG. 14E, in some other embodiments, the depth D1 and width W1 of the first recessed part RC1 may be different from the depth D2 and the width W2 of the second recessed part RC2. Furthermore, the thermal interface material 406 is filled into the first recessed part RC1 and the second recessed part RC2. For example, the first protruding part 406PT1 completely fills into the first recessed part RC1, while the second protruding part 406PT2 partially fills into the second recessed part RC2. In such embodiment, since the thermal interface material 406 does not completely fill into the second recessed part RC2, air spaces AX2 are still located in between the protruding part PT1 of the first portion 204A1 of the insulating encapsulant 204' and edges of the second semiconductor die 102B.

In the above embodiments, it should be clear that the depth and width of the first recessed part RC1 and the second recessed part RC2 may be adjusted based on design requirement, while fulfilling a depth range of 1 μm to 10 μm. Furthermore, the thermal interface material 406 may or may not fill into the first recessed part RC1 and the second recessed part RC2. In some embodiments, when air spaces AX1, AX2 exists in the package structure, there may be residual die attach film material (adhesive material) located in the air spaces AX1. AX2. It is noted that all of the different arrangements of the thermal interface material 406 relative to the first recessed part RC1 and the second recessed part RC1 of the insulating encapsulant 204' as shown in FIG. 14A to FIG. 14E may be applied to the package structure PK1 shown in FIG. 13 above, and applied to any package structures (or package-on-package structures) described hereafter.

Figure 15:
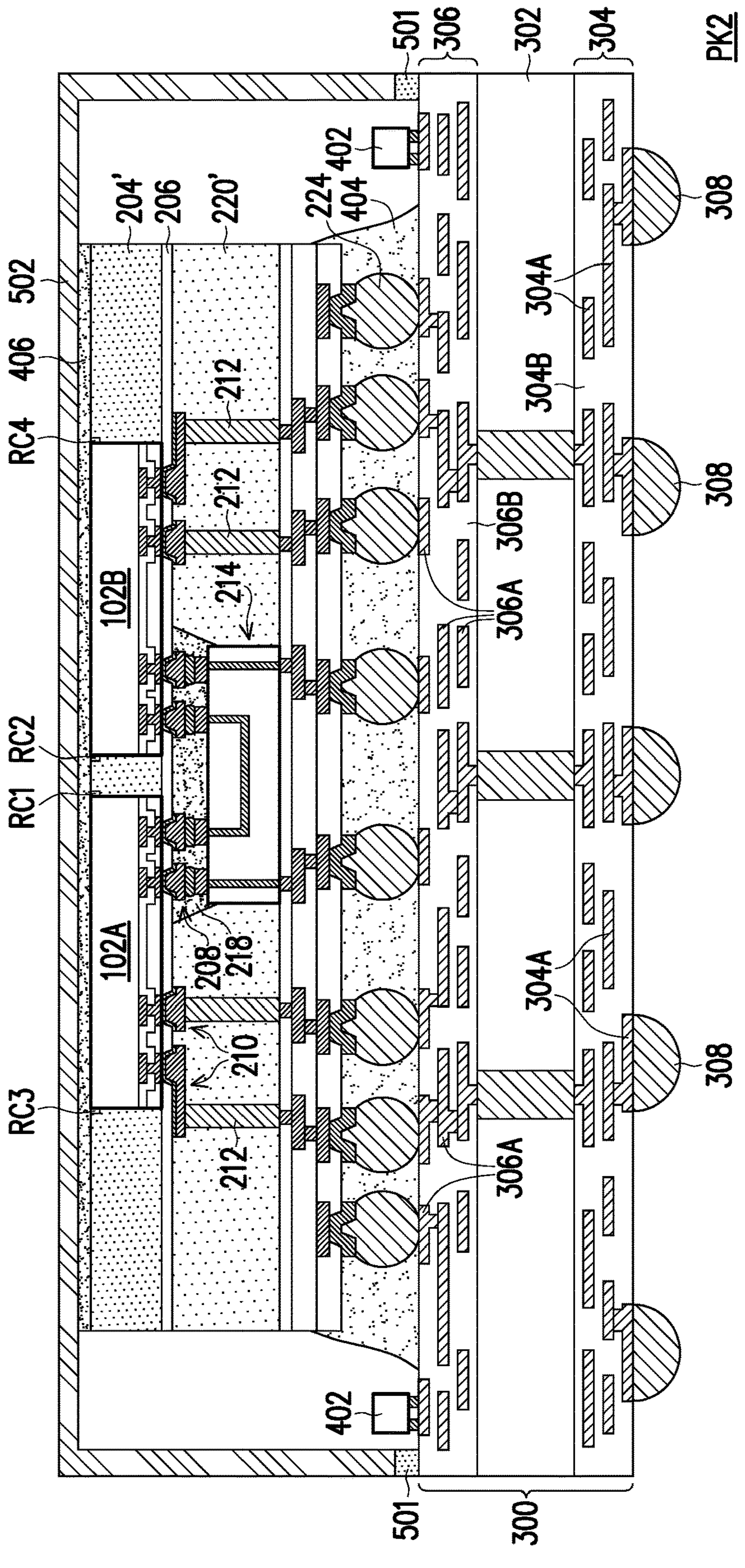
FIG. 15 is a schematic sectional view of a package structure in accordance with some other embodiments of the present disclosure.

FIG. 15 is a schematic sectional view of a package structure in accordance with some other embodiments of the present disclosure. The package structure PK2 illustrated in FIG. 15 is similar to the package structure PK1 illustrated in FIG. 13. Therefore, the same reference numerals are used to refer to the same or liked parts, and the detailed descriptions will not be repeated herein. The difference between the embodiments is that in the package structure PK2 shown in FIG. 15, the second portion 204A2 of the insulating encapsulant 204' further includes a third recessed part RC3 and a fourth recessed part RC4. For example, the third recessed part RC3 and the fourth recessed part RC4 may be formed in a way similar to the first recessed part RC1 and the second recessed part RC2 by removing the die attach films 104. In some embodiments, the third recessed part RC3 is located at edges of the first semiconductor die 102A, and is opposite to the first recessed part RC1. Furthermore, the fourth recessed part RC4 is located at edges of the second semiconductor die 102B, and is opposite to the second recessed part RC2.

In the package structure PK2 shown in FIG. 15, due to the presence of the first recessed part RC1 and the second recessed part RC2 located at edges of the first semiconductor die 102A and the second semiconductor die 102B, the die to die bending strength of the first portion 204A1 of the insulating encapsulant 204' can be improved. As such, a molding crack issue of the insulating encapsulant 204' surrounding the first semiconductor die 102A and the second semiconductor die 102B may be resolved.

Figure 16:
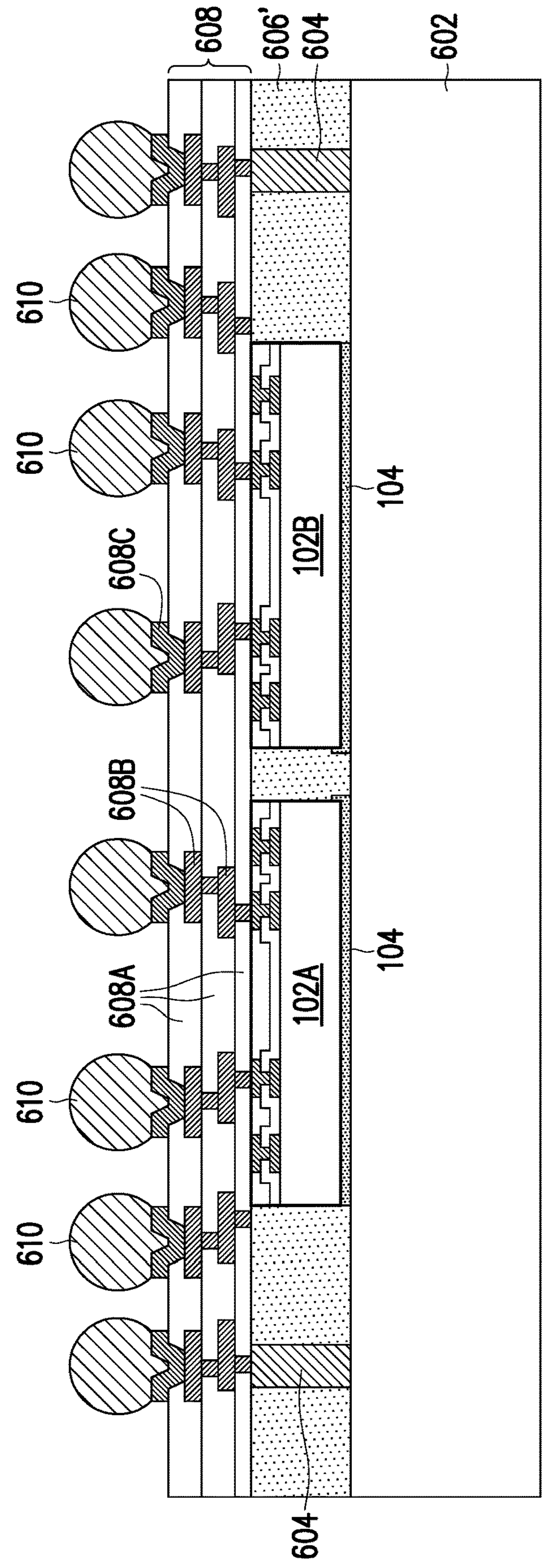
FIG. 16 to FIG. 18 are schematic sectional views of various stages in a method of fabricating a package structure according to some other exemplary embodiments of the present disclosure.
Figure 17:
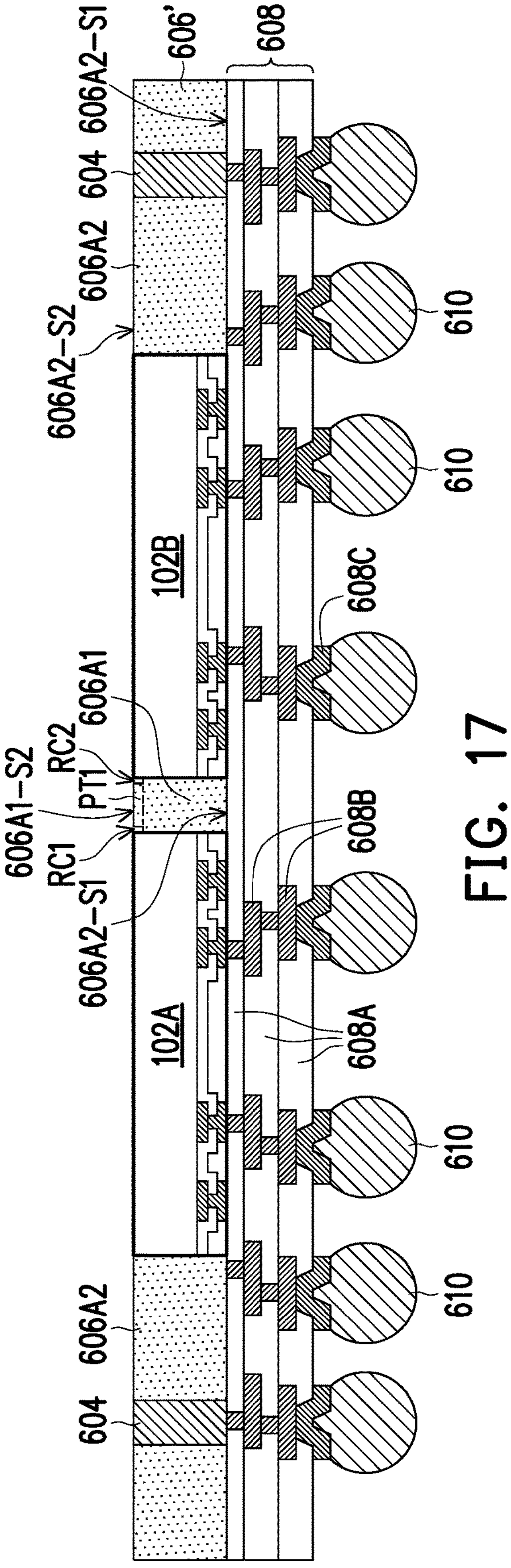
Figure 18:
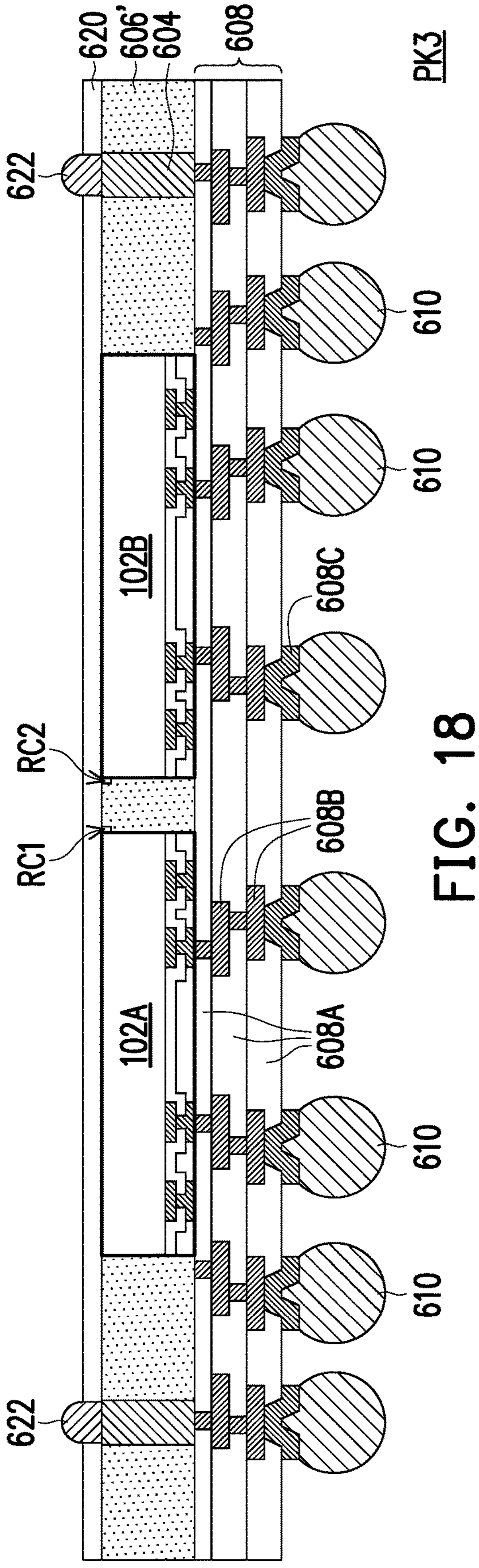

FIG. 16 to FIG. 18 are schematic sectional views of various stages in a method of fabricating a package structure according to some other exemplary embodiments of the present disclosure. As illustrated in FIG. 16, the first semiconductor die 102A and the second semiconductor die 102B as shown in FIG. 2 having die attach films 104 located on backside surfaces are placed on a carrier substrate 602. The carrier substrate 602 may be a glass carrier or any suitable carrier for carrying a semiconductor wafer or a reconstituted wafer for the manufacturing method of the package structure. The first semiconductor die 102A and the second semiconductor die 102B are spaced apart by a first distance X1, whereby the first distance X1 is in a range of 100 μm to 200 μm. In some embodiments, a plurality of through insulator vias 604 are provided on the carrier substrate 602 to surround the first semiconductor die 102A and the second semiconductor die 102. In some embodiments, the through insulator vias 604 are through integrated fan-out ("InFO") vias. In one embodiment, the formation of the through insulator vias 604 includes forming a mask pattern (not shown) with openings, then forming a metallic material (not shown) filling up the openings by electroplating or deposition, and removing the mask pattern to form the through insulator vias 604 on the carrier substrate 602. In some embodiments, the material of the mask pattern may include a positive photo-resist or a negative photo-resist. In one embodiment, the material of the through insulator vias 604 may include a metal material such as copper or copper alloys, or the like. However, the disclosure is not limited thereto.

After placing the first semiconductor die 102A, the second semiconductor die 102B and the through insulator vias 604 on the carrier substrate 602, the insulating encapsulant 606', the redistribution layer 608 (including dielectric layers 608A and conductive elements 608B), the conductive pads 608C and the conductive terminals 610 may be formed in a similar way as with the insulating encapsulant 220', the redistribution layer RDL2, the conductive pads 222C and the conductive terminals 224 of the package structure PK1 described in FIG. 1A to FIG. 13. As such, the details of the insulating encapsulant 606', the redistribution layer 608, the conductive pads 608C and the conductive terminals 610 will be omitted herein.

Referring to FIG. 17, the structure shown in FIG. 16 is turned upside down, and the carrier substrate 602 is debonded so as to separate the first semiconductor die 102A and the second semiconductor die 102B from the carrier substrate 602. For example, the de-bonding process include projecting a light such as a laser light or an UV light on a de-bonding layer on the carrier substrate 202, so that the carrier substrate 202 can be easily removed. In certain embodiments, the die attach films 104 attached to the backside surfaces of the first semiconductor die 102A and the second semiconductor die 102B are removed as well. Upon removing the die attach films 104, the first portion 606A1 of the insulating encapsulant 606' sandwiched in between the first semiconductor die 102A and the second semiconductor die 102B is formed with a first recessed part RC1 adjacent to an edge of the first semiconductor die 102A, and is formed with a second recessed part RC2 adjacent to an edge of the second semiconductor die 102B. For example, a protruding part PT1 is located in between the first recessed part RC1 and the second recessed part RC2.

In some embodiments, the first portion 606A1 of the insulating encapsulant 606' has a first surface 606A1-S1 and a second surface 606A1-S2 opposite to the first surface 606A1-S1. The first surface 606A1-S1 of the first portion 606A1 is a planar surface, while the second surface 606A1-S2 of the first portion 606A1 includes the protruding part PT1. Furthermore, the second portion 606A2 surrounding the first portion 606A1 has a third surface 606A2-S1 and a fourth surface 606A2-S2 opposite to the third surface 606A2-S1, whereby the third surface 606A2-S1 and the fourth surface 606A2-S2 are planar surfaces. In some embodiments, the fourth surface 606A2-S2 of the second portion 606A2 is substantially levelled with the second surface 606A1-S2 of the first portion 204A1 including the protruding part PT1, and substantially levelled with a top surface of the through insulator vias 604.

Referring to FIG. 18, in a subsequent step, a dielectric layer 620 is disposed over the backside surfaces of the first semiconductor die 102A and the second semiconductor die 102B. In some embodiments, the dielectric layer 620 has openings revealing the through insulator vias 604. In some embodiments, conductive terminals 622 are further disposed in the openings to be electrically connected to the through insulator vias 604. Up to here, a package structure PK3 having dual side terminals can be accomplished. In the package structure PK3 illustrated in FIG. 18, the dielectric layer 620 is not filled into the first recessed part RC1 and the second recessed part RC2. In other words, air spaces may be located in between the protruding part PT1 of the first portion 606A1 of the insulating encapsulant 606' and edges of the first and second semiconductor dies 102A, 102B (similar to the arrangement shown in FIG. 14A). In the package structure PK3, due to the presence of the first recessed part RC1 and the second recessed part RC2 located at edges of the first semiconductor die 102A and the second semiconductor die 102B, the die to die bending strength of the first portion 606A1 of the insulating encapsulant 606' can be improved. As such, a molding crack issue of the insulating encapsulant 606' surrounding the first semiconductor die 102A and the second semiconductor die 102B may be resolved.

Figure 19:
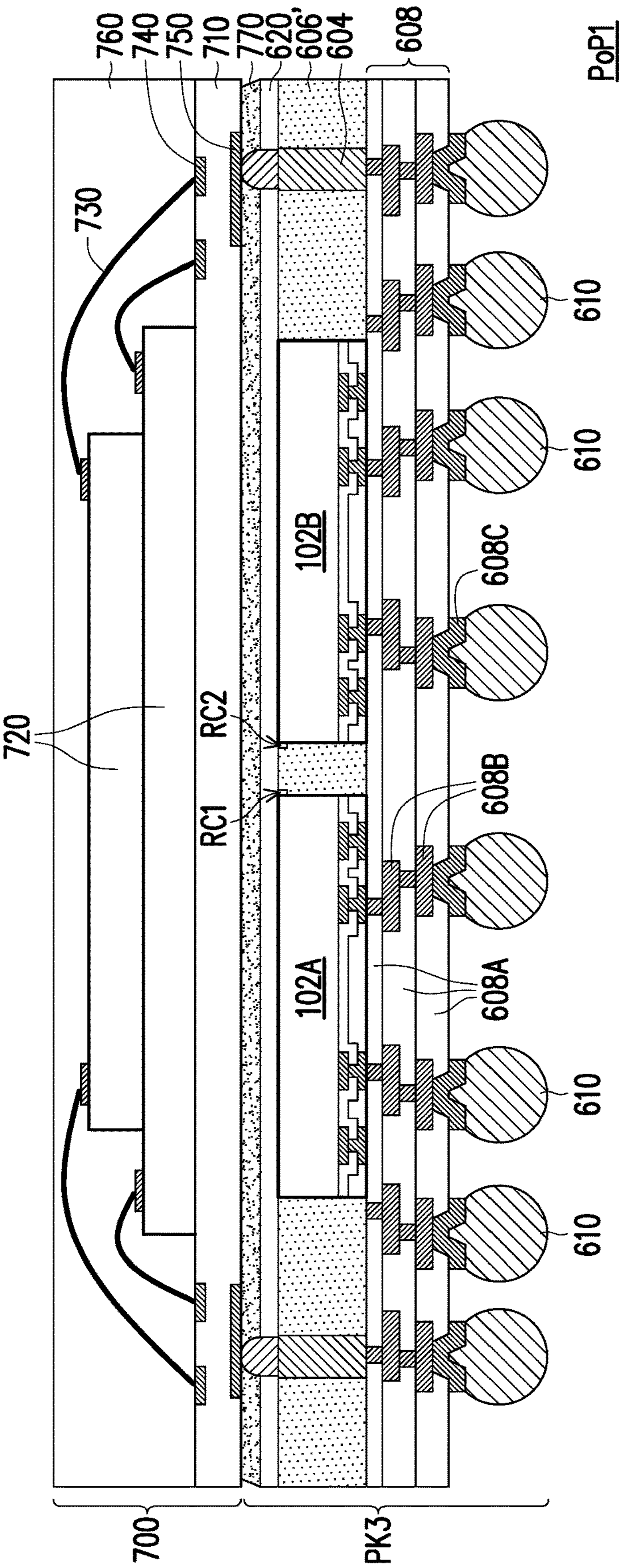
FIG. 19 is a schematic sectional view of a package-on-package (PoP) structure in accordance with some embodiments of the present disclosure.

FIG. 19 is a schematic sectional view of a package-on-package (PoP) structure in accordance with some embodiments of the present disclosure. Referring to FIG. 19, after fabricating the package structure PK3 shown in FIG. 18, a second package 700 may be stacked on the package structure PK3 (first package) so as to form a package-on-package (PoP) structure. As illustrated in FIG. 19, the second package 700 is disposed on the package structure PK3, and electrically connected to the conductive terminals 622 of the package structure PK3.

In some embodiments, the second package 700 has a substrate 710, a plurality of semiconductor chips 720 mounted on one surface (e.g. top surface) of the substrate 710 and stacked on top of one another. In some embodiments, bonding wires 730 are used to provide electrical connections between the semiconductor chips 720 and pads 740 (such as bonding pads). In some embodiments, an insulating encapsulant 760 is formed to encapsulate the semiconductor chips 720 and the bonding wires 730 to protect these components. In some embodiments, through insulator vias (not shown) may be used to provide electrical connection between the pads 740 and conductive pads 750 (such as bonding pads) that are located on another surface (e.g. bottom surface) of the substrate 710. In certain embodiments, the conductive pads 750 are electrically connected to the semiconductor chips 720 through these through insulator vias (not shown). In some embodiments, the conductive pads 750 of the package structure 700 are electrically connected to the conductive terminals 622 of the package structure PK3. In some embodiments, an underfill 770 is further provided to fill in the spaces between the package structure PK3 and the second package 700 to surround an protect the conductive terminals 622. After stacking the second package 700 on the package structure PK3 (first package) and providing electrical connection therebetween, a package-on-package structure POP1 can be fabricated.

In the package-on-package structure POP1 illustrated in FIG. 19, due to the presence of the first recessed part RC1 and the second recessed part RC2 located at edges of the first semiconductor die 102A and the second semiconductor die 102B, the die to die bending strength of the first portion 606A1 of the insulating encapsulant 606' can be improved. As such, a molding crack issue of the insulating encapsulant 606' surrounding the first semiconductor die 102A and the second semiconductor die 102B may be resolved.

Figure 20:
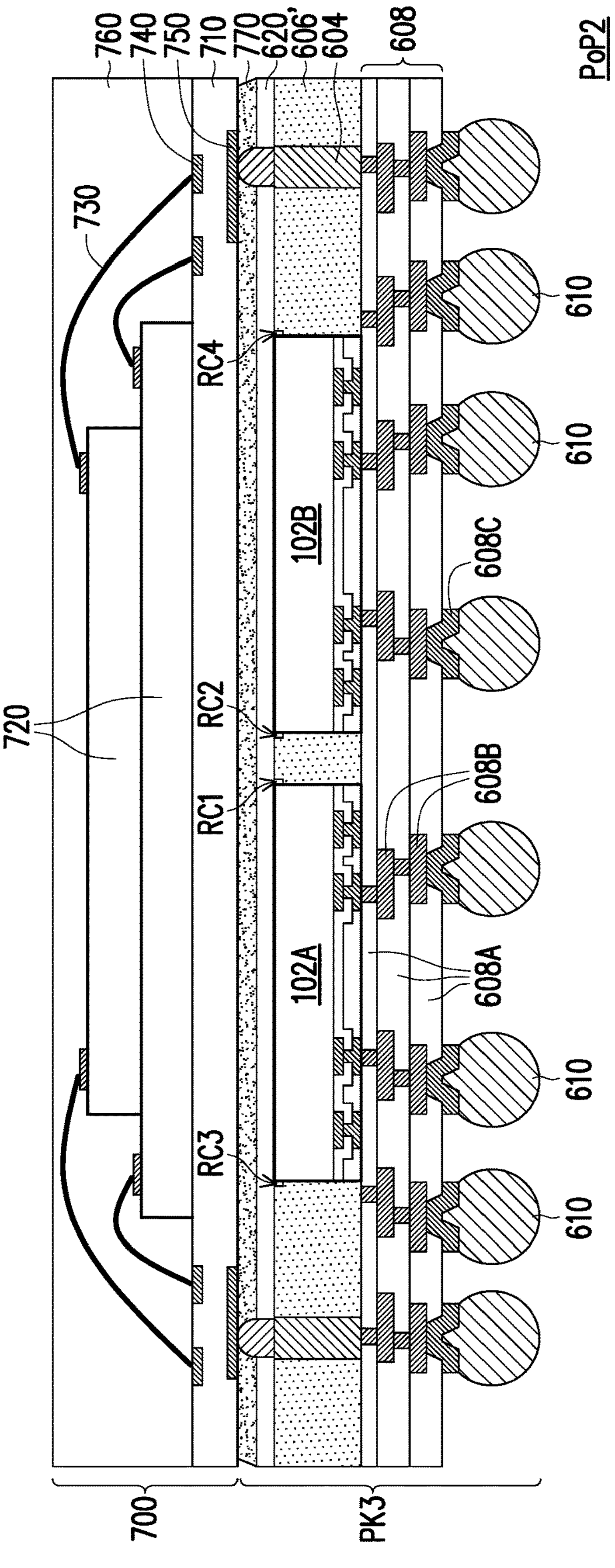
FIG. 20 is a schematic sectional view of a package-on-package (PoP) structure in accordance with some other embodiments of the present disclosure.

FIG. 20 is a schematic sectional view of a package-on-package (PoP) structure in accordance with some other embodiments of the present disclosure. The package-on-package structure PoP2 illustrated in FIG. 20 is similar to the package-on-package structure PoP1 illustrated in FIG. 19. Therefore, the same reference numerals are used to refer to the same or liked parts, and the detailed descriptions will not be repeated herein. The difference between the embodiments is that in the package-on-package structure PoP2 shown in FIG. 20, the second portion 606A2 of the insulating encapsulant 606' further includes a third recessed part RC3 and a fourth recessed part RC4. For example, the third recessed part RC3 and the fourth recessed part RC4 may be formed in a way similar to the first recessed part RC1 and the second recessed part RC2 by removing the die attach films 104. In some embodiments, the third recessed part RC3 is located at edges of the first semiconductor die 102A, and is opposite to the first recessed part RC1. Furthermore, the fourth recessed part RC4 is located at edges of the second semiconductor die 102B, and is opposite to the second recessed part RC2.

In the package-on-package structure PoP2 illustrated in FIG. 20, due to the presence of the first recessed part RC1 and the second recessed part RC2 located at edges of the first semiconductor die 102A and the second semiconductor die 102B, the die to die bending strength of the first portion 204A1 of the insulating encapsulant 204' can be improved. As such, a molding crack issue of the insulating encapsulant 204' surrounding the first semiconductor die 102A and the second semiconductor die 102B may be resolved.

In the above-mentioned embodiments, the package structure includes an insulating encapsulant having a first recessed part and a second recessed part located at edges of the first semiconductor die and the second semiconductor die. As such, as compared to an insulating encapsulant formed with planar surfaces in between two adjacent dies, the die to die bending strength of the first portion of the insulating encapsulant can be improved. Furthermore, a molding crack issue of the insulating encapsulant encapsulating the first semiconductor die and the second semiconductor die may be resolved.

In accordance with some embodiments of the present disclosure, a package structure includes a first semiconductor die, a second semiconductor die, an insulating encapsulant and a redistribution layer. The insulating encapsulant laterally surrounds the first semiconductor die and the second semiconductor die, wherein the insulating encapsulant includes a first portion sandwiched in between the first semiconductor die and the second semiconductor die, the first portion has a first recessed part adjacent to an edge of the first semiconductor die, and a second recessed part adjacent to an edge of the second semiconductor die. The redistribution layer is disposed on and electrically connected to the first semiconductor die and the second semiconductor die.

In accordance with some other embodiments of the present disclosure, a package structure includes two semiconductor dies, an insulating encapsulant, a thermal interface material and a bridge structure. A first portion of the insulating encapsulant is disposed in between the two semiconductor dies, wherein a first surface of the first portion is a planar surface, and a second surface opposite to the first surface of the first portion has a protruding part. A second portion of the insulating encapsulant is surrounding the first portion and the two semiconductor dies, wherein a third surface and a fourth surface opposite to the third surface of the second portion are planar surfaces. The thermal interface material is disposed on backside surfaces of the two semiconductor dies. The bridge structure is partially overlapped with the two semiconductor dies and electrically connecting the two semiconductor dies to one another.

In accordance with yet another embodiment of the present disclosure, a method of fabricating a package structure is described. The method includes the following steps. A semiconductor wafer is provided. A die attach film layer is provided over the semiconductor wafer. The semiconductor wafer along with the die attach film layer are sliced to form a first semiconductor die and a second semiconductor die having die attach films attached to backside surfaces of the first semiconductor die and the second semiconductor die. The first semiconductor die and the second semiconductor die are placed over a carrier. An insulating encapsulant is formed to laterally surround the first semiconductor die and the second semiconductor die and the die attach films. A redistribution layer is formed to be disposed on and electrically connected to the first semiconductor die and the second semiconductor die. The carrier is de-bonded and the die attach films attached to the backside surfaces of the first semiconductor die and the second semiconductor die are removed. After removing the die attach films, a first portion of the insulating encapsulant sandwiched in between the first semiconductor die and the second semiconductor die is formed with a first recessed part adjacent to an edge of the first semiconductor die, and is formed with a second recessed part adjacent to an edge of the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a first semiconductor die and a second semiconductor die;

an insulating encapsulant laterally surrounding the first semiconductor die and the second semiconductor die, wherein the insulating encapsulant comprises a first portion sandwiched in between the first semiconductor die and the second semiconductor die, the first portion has a first recessed part adjacent to an edge of the first semiconductor die, and a second recessed part adjacent to an edge of the second semiconductor die, wherein a depth of the first recessed part is different from a depth of the second recessed part; and a redistribution layer disposed on and electrically connected to the first semiconductor die and the second semiconductor die.

2. The package structure according to claim 1, further comprising a bridge structure disposed on the first semiconductor die and the second semiconductor die, and electrically connected to the first semiconductor die, the second semiconductor die and the redistribution layer; and a second insulating encapsulant laterally surrounding the bridge structure.

3. The package structure according to claim 2, further comprising:

first conductive features disposed on the first semiconductor die and the second die, and electrically connecting the first semiconductor die and the second die to the bridge structure;

second conductive features disposed on the first semiconductor die and the second die; and through vias disposed on the second conductive features and electrically connecting the second conductive features to the redistribution layer.

4. The package structure according to claim 1, wherein the first semiconductor die and the second semiconductor die are spaced apart by a first distance, and the first distance is in a range of 100 μm to 200 μm.

5. The package structure according to claim 1, wherein the depth of the first recessed part and the depth of the second recessed part are respectively in a range of 1 μm to 10 μm.

6. The package structure according to claim 1, wherein the first portion of the insulating encapsulant further comprises a protruding part that is located in between the first recessed part and the second recessed part.

7. The package structure according to claim 1, further comprises a thermal interface material disposed on backside surfaces of the first semiconductor die and the second semiconductor die, wherein the thermal interface material is filled into the first recessed part and the second recessed part.

8. The package structure according to claim 7, wherein the thermal interface material is partially filled into the first recessed part, and fully filled into the second recessed part.

9. A package structure, comprising:

two semiconductor dies;

a first portion of an insulating encapsulant disposed in between the two semiconductor dies, wherein a first surface of the first portion is a planar surface, and a second surface opposite to the first surface of the first portion has a protruding part;

a second portion of the insulating encapsulant surrounding the first portion and the two semiconductor dies, wherein a third surface and a fourth surface opposite to the third surface of the second portion are planar surfaces;

a thermal interface material disposed on backside surfaces of the two semiconductor dies, wherein the thermal interface material partially covers side surfaces of the two semiconductor dies, and the thermal interface material is contacting the protruding part of the first portion; and a bridge structure partially overlapped with the two semiconductor dies and electrically connecting the two semiconductor dies to one another.

10. The package structure according to claim 9, further comprising air spaces located in between the protruding part of the first portion of the insulating encapsulant and edges of the two semiconductor dies.

11. The package structure according to claim 9, wherein a height of the protruding part of the first portion is in a range of 1 μm to 10 μm.

12. The package structure according to claim 9, further comprising:

a redistribution layer disposed below the bridge structure and electrically connected to the bridge structure and the two semiconductor dies;

a circuit substrate disposed underneath the redistribution layer and electrically connected to the redistribution layer; and a lid structure disposed on the circuit substrate, wherein the lid structure is covering the two semiconductor dies and the bridge structure, and is in contact with the thermal interface material.

13. The package structure according to claim 9, wherein a maximum width of the first portion of the insulating encapsulant is in a range of 100 μm to 200 μm.

14. A method of fabricating a package structure, comprising:

providing a semiconductor wafer;

forming a die attach film layer over the semiconductor wafer;

slicing the semiconductor wafer along with the die attach film layer to form a first semiconductor die and a second semiconductor die having die attach films attached to backside surfaces of the first semiconductor die and the second semiconductor die;

placing the first semiconductor die and the second semiconductor die over a carrier;

forming an insulating encapsulant laterally surrounding the first semiconductor die and the second semiconductor die and the die attach films;

forming a redistribution layer disposed on and electrically connected to the first semiconductor die and the second semiconductor die; and debonding the carrier and removing the die attach films attached to the backside surfaces of the first semiconductor die and the second semiconductor die, wherein after removing the die attach films, a first portion of the insulating encapsulant sandwiched in between the first semiconductor die and the second semiconductor die is formed with a first recessed part adjacent to an edge of the first semiconductor die, and is formed with a second recessed part adjacent to an edge of the second semiconductor die, wherein a depth of the first recessed part is different from a depth of the second recessed part.

15. The method according to claim 14, further comprising:

disposing a bridge structure on the first semiconductor die and the second semiconductor die, and electrically connecting the bridge structure to the first semiconductor die and the second semiconductor die, and forming the redistribution layer on the bridge structure, and electrically connecting the redistribution layer to the bridge structure.

16. The method according to claim 14, wherein the depth of the first recessed part and the depth of the second recessed part are formed in a range of 1 μm to 10 μm.

17. The method according to claim 14, wherein after removing the die attach films, the first portion of the insulating encapsulant is further formed with a protruding part that is located in between the first recessed part and the second recessed part.

18. The method according to claim 14, further comprises forming a thermal interface material on backside surfaces of the first semiconductor die and the second semiconductor die, wherein the thermal insulating material is filled into the first recessed part and the second recessed part.

19. The package structure according to claim 1, wherein the first recessed part extends along a first sidewall at the edge of the first semiconductor die, the second recessed part extends along a second sidewall at the edge of the second semiconductor die, and the first sidewall is facing the second sidewall.

20. The package structure according to claim 9, further comprising an underfill structure located in between the bridge structure and the two semiconductor dies, wherein the underfill structure is vertically overlapped with the protruding part of the first portion.

* * * * *